US010754207B2

(12) United States Patent
Iwata et al.

(10) Patent No.: US 10,754,207 B2
(45) Date of Patent: Aug. 25, 2020

(54) LIQUID CRYSTAL DISPLAY DEVICE

(71) Applicant: SHARP KABUSHIKI KAISHA, Sakai, Osaka (JP)

(72) Inventors: Yosuke Iwata, Sakai (JP); Mitsuhiro Murata, Sakai (JP); Takuma Tomotoshi, Sakai (JP); Satoshi Matsumura, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 26 days.

(21) Appl. No.: 16/090,255

(22) PCT Filed: Mar. 23, 2017

(86) PCT No.: PCT/JP2017/011567
§ 371 (c)(1),
(2) Date: Sep. 30, 2018

(87) PCT Pub. No.: WO2017/170069
PCT Pub. Date: Oct. 5, 2017

(65) Prior Publication Data
US 2019/0121208 A1   Apr. 25, 2019

(30) Foreign Application Priority Data

Mar. 30, 2016   (JP) ................. 2016-067585

(51) Int. Cl.
G02F 1/1343   (2006.01)
G02F 1/1368   (2006.01)
(Continued)

(52) U.S. Cl.
CPC ........ *G02F 1/134363* (2013.01); *G02F 1/133* (2013.01); *G02F 1/137* (2013.01);
(Continued)

(58) Field of Classification Search
CPC ......... G02F 1/136213; G02F 1/134363; G02F 2001/134372
See application file for complete search history.

(56) References Cited

U.S. PATENT DOCUMENTS

2002/0041354 A1   4/2002  Noh et al.
2004/0057003 A1*  3/2004  Yoo .................. G02F 1/133707
                                                                349/141

FOREIGN PATENT DOCUMENTS

JP   2002-182230 A   6/2002
JP   2008-083320 A   4/2008
(Continued)

*Primary Examiner* — Alexander P Gross
(74) *Attorney, Agent, or Firm* — ScienBiziP, P.C.

(57) ABSTRACT

A liquid crystal display device includes an upper substrate and a lower substrate; and a liquid crystal layer sandwiched between the upper and lower substrates. The lower substrate includes a pixel electrode, a first auxiliary capacitance electrode, and a second auxiliary capacitance electrode for one pixel, and one or two auxiliary capacitance lines for one pixel line including pixels. The two auxiliary capacitive electrodes are electrically connected to different auxiliary capacitance lines. Each of the first auxiliary capacitance electrode and the second auxiliary capacitance electrode and the pixel electrode overlap each other in a plan view. The first auxiliary capacitance electrode and the second auxiliary capacitance electrode differ from each other in shape in a display region of each of the pixels. The shape of the first auxiliary capacitance electrode in a first pixel is identical to the shape of the second auxiliary capacitance electrode in a second pixel adjacent to the first pixel.

18 Claims, 17 Drawing Sheets

(51) Int. Cl.
    *G09G 3/20*     (2006.01)
    *G09G 3/36*     (2006.01)
    *G02F 1/133*     (2006.01)
    *H01L 27/12*     (2006.01)
    *G02F 1/1337*     (2006.01)
    *G02F 1/1362*     (2006.01)
    *G02F 1/137*     (2006.01)

(52) U.S. Cl.
    CPC .......... G02F 1/1337 (2013.01); G02F 1/1368 (2013.01); G02F 1/136213 (2013.01); G02F 1/136286 (2013.01); G09G 3/20 (2013.01); G09G 3/36 (2013.01); H01L 27/1225 (2013.01); H01L 27/1255 (2013.01); *G02F 2001/13706* (2013.01); *G02F 2001/133738* (2013.01); *G02F 2001/134372* (2013.01); *G02F 2201/121* (2013.01); *G02F 2201/122* (2013.01); *G02F 2201/128* (2013.01); *G02F 2202/10* (2013.01); *G09G 3/3614* (2013.01); *G09G 2320/0247* (2013.01)

(56) References Cited

FOREIGN PATENT DOCUMENTS

| | | | |
|---|---|---|---|
| JP | 2009-086170 A | 4/2009 | |
| WO | 2013/031552 A1 | 3/2013 | |
| WO | WO-2013031552 A1 * | 3/2013 | ........... G09G 3/3648 |

\* cited by examiner

Liquid crystal initial alignment azimuth

Liquid crystal initial alignment azimuth

Fig. 10

|   | n | n+1 |
|---|---|---|
| m | (1)<br><br>Pixel<br>+Vpix1<br><br>CSa<br>+Vcs1<br><br>CSb<br>−Vcs1 | (2)<br><br>Pixel<br>−Vpix1<br><br>CSa<br>−Vcs1<br><br>CSb<br>+Vcs1 |
| m+1 | (3)<br><br>Pixel<br>−Vpix1<br><br>CSa<br>−Vcs1<br><br>CSb<br>+Vcs1 | (4)<br><br>Pixel<br>+Vpix1<br><br>CSa<br>+Vcs1<br><br>CSb<br>−Vcs1 |

Fig. 14

|   | n | n+1 |
|---|---|---|
| m | (1)<br><br>Pixel<br>+Vpix1<br><br>CSa<br>+Vcs1<br><br>CSb<br>−Vcs1 | (2)<br><br>Pixel<br>−Vpix1<br><br>CSa<br>−Vcs1<br><br>CSb<br>+Vcs1 |
| m+1 | (3)<br><br>Pixel<br>−Vpix1<br><br>CSa<br>−Vcs1<br><br>CSb<br>+Vcs1 | (4)<br><br>Pixel<br>+Vpix1<br><br>CSa<br>+Vcs1<br><br>CSb<br>−Vcs1 |

Fig. 22

|  | n | n+1 |
|---|---|---|
| m | (1)<br><br>Pixel<br>+Vpix1<br><br>CSa<br>+Vcs1<br><br>CSb<br>−Vcs2 | (2)<br><br>Pixel<br>+Vpix1<br><br>CSa<br>+Vcs1<br><br>CSb<br>−Vcs2 |
| m+1 | (3)<br><br>Pixel<br>−Vpix1<br><br>CSa<br>−Vcs1<br><br>CSb<br>+Vcs2 | (4)<br><br>Pixel<br>−Vpix1<br><br>CSa<br>−Vcs1<br><br>CSb<br>+Vcs2 | ns, a smart phones, and a tablet
LIQUID CRYSTAL DISPLAY DEVICE

TECHNICAL FIELD

The present invention relates to a liquid crystal display device. More particularly the present invention relates to a liquid crystal display device in a horizontal alignment mode.

BACKGROUND ART

A liquid crystal display device is constructed while a liquid crystal display element is sandwiched between a pair of glass substrates. By utilizing the features such as thinness, light weight, and low power consumption, the liquid crystal display device is widely used in a car navigation, an electronic book, a photo frame, industrial equipment, a television, a personal computer, a smart phones, and a tablet terminal, which are indispensable for everyday life and business. In these applications, liquid crystal display devices of various modes relating to the electrode arrangement and design of a substrate are studied in order to change optical characteristics of a liquid crystal layer.

For example, a vertical alignment (VA) mode, such as a multi-domain vertical alignment (MVA) mode, in which liquid crystal molecules having negative anisotropy of dielectric constant are vertically aligned with respect to a substrate surface, an in-plane switching (IPS) mode in which the liquid crystal molecules having positive or negative anisotropy of dielectric constant are horizontally aligned with respect to the substrate surface to apply a lateral electric field to the liquid crystal layer, and a fringe field switching (FFS) mode can be cited as a recent display system of the liquid crystal display device.

Among others, the FFS mode is a liquid crystal mode that is widely used in smartphones and tablet terminals in recent years. An FFS mode liquid crystal display device is disclosed, the FFS mode liquid crystal display device including: a first and second transparent insulating substrates that are disposed opposite each other with a predetermined distance with a liquid crystal layer containing a plurality of liquid crystal molecules interposed therebetween; pluralities of scanning signal lines and data signal lines arranged in a matrix on the first transparent substrate so as to restrict a unit pixel; a thin-film transistor provided at an intersection of the scanning signal line and the data signal line; a counter electrode disposed in each unit pixel and made of a transparent conductor; and a pixel electrode disposed in each unit pixel so as to be insulated from the counter electrode, the pixel electrode made of a transparent conductor including pluralities of upper slits and lower slits arranged at a predetermined inclination such that a symmetrical shape is formed with a long side of the pixel as a center (for example, see Patent Literature 1).

A method in which polarity inversion drive is performed by changing potential at the auxiliary capacitance line corresponding to the scanning signal line after a selection period of the scanning signal line is disclosed as a method for reducing power consumption of an active matrix type liquid crystal display device (for example, see Patent Literature 2).

CITATION LIST

Patent Literature

Patent Literature 1: JP-A-2002-182230
Patent Literature 2: JP-A-2009-086170

SUMMARY OF INVENTION

Technical Problem

It is conceivable that the polarity inversion drive is performed by changing the potential at the auxiliary capacitance line corresponding to the scanning signal line according to the selection of each scanning signal line. In this case, there is a problem in that a flicker is generated.

The reason why the flicker is generated is that only line inversion drive can be performed in each 1H (one horizontal scanning period).

An auxiliary capacitance line CSm (auxiliary capacitance is also referred to as CS in the present description) corresponding to a scanning line Ym in FIG. 2 of Patent Literature 2 is electrically connected only to a CS electrode of the pixel accompanying the scanning line Ym, and (2) the potential at the CS electrode is common (common along a pixel row) in each horizontal line. For this reason, it is necessary to have the same polarity in the electrode potential at each pixel in each horizontal line (pixel row), and only line inversion drive can be performed, so that the flicker is generated.

In view of the above state of the art, it is an object of the present invention to provide a liquid crystal display device that can perform dot inversion drive and suppress the generation of the flicker.

Solution to Problem

In the present invention, the above problem can be solved by applying the potentials of the same magnitude with polarity inversion to two kinds of CS electrodes provided in a certain pixel.

According to one aspect of the present invention, a liquid crystal display device may include: an upper substrate and a lower substrate; and a liquid crystal layer sandwiched between the upper and lower substrates, wherein the lower substrate includes a pixel electrode, a first auxiliary capacitance electrode, and a second auxiliary capacitance electrode for one pixel, and one or two auxiliary capacitance lines for one pixel line including pixels, a group of the first auxiliary capacitive electrodes and a group of the second auxiliary capacitive electrodes in a first pixel line are electrically connected to different auxiliary capacitance lines, each of the first auxiliary capacitance electrode and the second auxiliary capacitance electrode and the pixel electrode in each of the pixels overlap each other in a plan view, the first auxiliary capacitance electrode and the second auxiliary capacitance electrode differ from each other in shape in a display region of each of the pixels, the shape of the first auxiliary capacitance electrode in the display region of a first pixel is identical to the shape of the second auxiliary capacitance electrode in the display region of a second pixel adjacent to the first pixel, the shape of the second auxiliary capacitance electrode in the display region of the first pixel is identical to the shape of the first auxiliary capacitance electrode in the display region of the second pixel adjacent to the first pixel, and each of the first auxiliary capacitance electrodes and each of the second auxiliary capacitance electrodes are configured to be driven by a driving operation through the respective corresponding auxiliary capacitance lines to which the first auxiliary capacitance electrode and the second auxiliary capacitance electrode are electrically connected.

According to another aspect of the present invention, a liquid crystal display device may include: an upper substrate and a lower substrate; and a liquid crystal layer sandwiched between the upper and lower substrates, wherein the lower substrate includes a pixel electrode, a first auxiliary capacitance electrode, and a second auxiliary capacitance electrode for one pixel, and one or two auxiliary capacitance lines for one pixel line including pixels, a group of the first auxiliary capacitive electrodes and a group of the second auxiliary capacitive electrodes in a first pixel line are electrically connected to different auxiliary capacitance lines, each of the first auxiliary capacitance electrode and the second auxiliary capacitance electrode overlaps the pixel electrode in each of the pixels in a plan view, and is capable of forming an auxiliary capacitance with the pixel electrode, the magnitude of the auxiliary capacitance formed by the first auxiliary capacitance electrode differs from the magnitude of the auxiliary capacitance formed by the second auxiliary capacitance electrode in each of the pixels, the magnitude of the auxiliary capacitance formed by the first auxiliary capacitance electrode in a first pixel is identical to the magnitude of the auxiliary capacitance formed by the second auxiliary capacitance electrode in a second pixel adjacent to the first pixel, the magnitude of the auxiliary capacitance formed by the second auxiliary capacitance electrode in the first pixel is identical to the magnitude of the auxiliary capacitance formed by the first auxiliary capacitance electrode in the second pixel adjacent to the first pixel, and each of the first auxiliary capacitance electrodes and each of the second auxiliary capacitance electrodes are configured to be driven by a driving operation through the respective corresponding auxiliary capacitance lines to which the first auxiliary capacitance electrode and the second auxiliary capacitance electrode are electrically connected.

In the present description, "one pixel line" is one pixel row or one pixel column in a plurality of pixels arranged in a row direction and a column direction in the display region of the liquid crystal display device. The expression "a group of the first auxiliary capacitive electrodes and a group of the second auxiliary capacitive electrodes in a first pixel line are electrically connected to the different auxiliary capacitance lines" means that the group of the first auxiliary capacitive electrodes in the first pixel line is electrically connected to one auxiliary capacitance line while the group of the second auxiliary capacitive electrodes in the first pixel line is electrically connected to one auxiliary capacitance line different from the one auxiliary capacitance line to which the group of the first auxiliary capacitive electrodes in the first pixel line is electrically connected. The display region (in the pixel) means an opening of a black matrix (BM).

In the conventional method for performing the polarity inversion drive of the liquid crystal display device, the line is complicated and an aperture ratio is degraded. The complication of the line and the degradation of the aperture ratio are caused by the fact that, when at least two kinds of CS electrodes are provided in each pixel to apply different potentials to the CS electrodes, as illustrated in FIG. 9, one of the two kinds of auxiliary capacitance electrodes existing in each pixel is electrically connected to an auxiliary capacitance line CS1$m$ and the other is electrically connected to an auxiliary capacitance line CS2$m$, thereby doubling the number of auxiliary capacitance lines.

In one preferable aspect of the present invention, one of the two kinds of CS electrodes provided in a pixel is electrically connected to the auxiliary capacitance line disposed in the pixel line including the pixel, and the other is electrically connected to the auxiliary capacitance line arranged disposed in the upper pixel line of the pixel line including the pixel or the lower pixel line. Consequently, different potentials are applied to the two kinds of CS electrodes, so that necessity of an increase in the number of auxiliary capacitance lines can be eliminated to solve the problem.

The inventors of the present invention have found a driving method (first driving system) in which the liquid crystal is driven by changing the voltage of the pixel electrode to applying inverted constant AC voltages to the first auxiliary capacitance electrode and the second auxiliary capacitance electrode. The present inventors have found that the liquid crystal is driven by switching the first auxiliary capacitance electrode and the second auxiliary capacitance electrode at the same potential (second driving system) and the first driving system and the second driving system are switched.

The liquid crystal display device of the present invention is, for example, a liquid crystal display device including upper and lower substrates and a liquid crystal layer sandwiched between the upper and lower substrates. Preferably, the lower substrate includes an electrode, the electrode includes a pixel electrode, a first auxiliary capacitance electrode located in a layer different from the pixel electrode, and a second auxiliary capacitance electrode located in the same layer as the first auxiliary capacitance electrode, the liquid crystal layer includes liquid crystal molecules aligned in a horizontal direction with respect to main surfaces of the upper and lower substrates when voltage is not applied, and the liquid crystal display device is configured to perform a driving operation to generate an electric field rotating a first group of the liquid crystal molecules in a horizontal plane with respect to the main surface and rotating a second group of the liquid crystal molecules in a direction opposite to the first group of the liquid crystal molecules in a horizontal plane with respect to the main surface using the electrodes.

The generation of the electric field using the electrode may be any method for generating the electric field using at least one electrode selected from the pixel electrode, the first auxiliary capacitance electrode, and the second auxiliary capacitance electrode. For example, preferably the electric field is always generated between the first auxiliary capacitance electrode and the second auxiliary capacitance electrode when the liquid crystal display device is powered on, the voltage is increased to rotate the liquid crystal molecules during the white display, and the voltage is decreased to reversely rotate the liquid crystal molecules during the black display.

For example, in the liquid crystal display device of the present invention driven by the lateral electric field, preferably two layers of electrodes having a comb-shaped electrode as the lower layer and a slit electrode (or comb-shaped electrode) as the upper layer are disposed with the insulating film interposed therebetween. In the liquid crystal display device, preferably a transverse electric field is always applied between the comb-shaped electrodes on the lower-layer side (the opposite side of the liquid crystal layer side) of the two layers of electrodes, and a voltage is applied to the slit electrode (or the comb-shaped electrode) on the upper-layer side to drive the slit electrode.

In one of preferable aspects of the present invention, in a liquid crystal mode in which the initial alignment is horizontal, the lower substrate has a two-layer electrode configuration, the lower-layer electrode is a pair of comb-shaped electrodes, and the upper-layer electrode is a slit electrode.

A first group of the liquid crystal molecules means some liquid crystal molecules in the liquid crystal molecules contained in the liquid crystal layer. The same holds true for a second group of the liquid crystal molecules, and the second group of the liquid crystal molecules means some liquid crystal molecules other than the first group of the liquid crystal molecules in the liquid crystal molecules contained in the liquid crystal layer.

In the liquid crystal display device of the present invention, usually the pixel electrode, the first auxiliary capacitance electrode, and the second auxiliary capacitance electrode are electrically separated from one another in the pixel, and the voltages at these electrodes can individually be controlled. In other words, usually each of the pixel electrode, the first auxiliary capacitance electrode, and the second auxiliary capacitance electrode can be set to a different potential greater than or equal to a threshold voltage. In the liquid crystal display device of the present invention, preferably the first auxiliary capacitance electrode and the second auxiliary capacitance electrode of the lower substrate constitute the pair of comb-shaped electrodes, and the slit electrode or the comb-shaped electrode is disposed as the pixel electrode on the first auxiliary capacitance electrode and the second auxiliary capacitance electrode with the insulating layer interposed therebetween.

That is, preferably the pixel electrode is disposed closer to the liquid crystal layer side than the first auxiliary capacitance electrode and the second auxiliary capacitance electrode. Preferably the first auxiliary capacitance electrode and the second auxiliary capacitance electrode each have the comb shape. In a plan view of the principal surfaces of the upper and lower substrates, preferably the extending direction of the first auxiliary capacitive electrodes and the extending direction of the second auxiliary capacitive electrodes cross the alignment direction of the liquid crystal molecules when the voltage is not applied. Preferably the interval between comb teeth of the first auxiliary capacitance electrode and the second auxiliary capacitance electrode ranges from 3 μm to 6 μm. Preferably the slit is provided in the pixel electrode, or the pixel electrode has the comb shape.

In a plan view of the main surfaces of the upper and lower substrates, preferably angles formed by the extending direction of the pixel electrode and the extending directions of the first auxiliary capacitance electrode and the second auxiliary capacitance electrode range from 83° to 90°. That is, each of the angle formed by the extending direction of the pixel electrode and the extending direction of the first auxiliary capacitance electrode and the angle formed by the extending direction of the pixel electrode and the extending direction of the second auxiliary capacitance electrode ranges from 83° to 90°. Preferably the extending direction of the first auxiliary capacitance electrode and the extending direction of the second auxiliary capacitance electrode are substantially parallel to each other.

The extending direction (slit extending direction) of the slit electrode means a longitudinal direction of the linear electrodes constituting the slit electrode. The extending direction of the comb-shaped electrode means the longitudinal direction of the linear electrode that is the branch in the trunk and the branch extending from the trunk, the trunk and branch constituting the comb-shaped electrode. In the conventional FFS mode liquid crystal display device, the fringe electric field is generated in the FFS electrode of the lower substrate during rise, and the liquid crystal molecules are rotated in one orientation by the fringe electric field. On the other hand, in the liquid crystal display device of the present invention, the lower substrate is constructed with the two layers of the electrodes (the above-described pixel electrode, the first auxiliary capacitance electrode, and the second auxiliary capacitance electrode) capable of applying three kinds of voltages, the electric field is generated between the pixel electrode and the first auxiliary capacitance electrode during the rise, and the liquid crystal molecules in a certain region and the liquid crystal molecules in other regions are rotated in opposite directions in a horizontal plane. During fall, the electric field is generated between the first auxiliary capacitance electrode and the second auxiliary capacitance electrode, and the liquid crystal molecules in a certain region and the liquid crystal molecules in the other region are rotated in the horizontal plane in the direction opposite to that during the rise.

Preferably the slit is provided in at least one of the pixel electrode, the first auxiliary capacitance electrode, and the second auxiliary capacitance electrode, and the liquid crystal display device is configured to perform the driving operation to generate the electric field rotating a first group of the liquid crystal molecules in the horizontal plane with respect to the main surface and rotating a second group of the liquid crystal molecules in the direction opposite to the first group of the liquid crystal molecules in the horizontal plane with respect to the main surface in the region overlapping the slit using the electrodes in a plan view of the main surface.

In the present description, the expression "rotating a first group of the liquid crystal molecules in the horizontal plane with respect to the main surface and rotating a second group of the liquid crystal molecules in the direction opposite to the first group of the liquid crystal molecules in the horizontal plane with respect to the main surface in the region overlapping the slit" means that, in a plan view of the main surfaces of the upper and lower substrates, the first group of the liquid crystal molecules is rotated in the horizontal plane in at least one of the regions that overlap and correspond to one slit and the second group of the liquid crystal molecules is rotated in the horizontal plane in the direction opposite to the first group of the liquid crystal molecules. Preferably the first group of the liquid crystal molecules is rotated in the horizontal plane in each of the regions that overlap and correspond to one slit and the second group of the liquid crystal molecules is rotated in the horizontal plane in the direction opposite to the first group of the liquid crystal molecules.

Among others, preferably the slit is provided in the pixel electrode, the first auxiliary capacitance electrode and the second auxiliary capacitance electrode constitute a pair of comb-shaped electrode, and the liquid crystal display device mainly is configured to perform the driving operation to generate the electric field rotating a part first group of the liquid crystal molecules in the horizontal plane with respect to the main surface and rotating a second group of the liquid crystal molecules in the direction opposite to the first group of the liquid crystal molecules in the horizontal plane with respect to the main surface in the region overlapping the slit provided in the pixel electrode in a plan view of the main surfaces, and rotating the first group of the liquid crystal molecules in the horizontal plane with respect to the main surface and rotating the second group of the liquid crystal molecules in the direction opposite to the first group of the liquid crystal molecules in the horizontal plane with respect to the main surface in the region overlapping region between the comb-shaped first auxiliary capacitance electrode and the comb-shaped second auxiliary capacitance electrode in a plan view of the main surfaces.

In the liquid crystal display device of the present invention, the liquid crystal driving electrode may be disposed on the upper substrate or may not be disposed on the upper substrate. However, preferably the liquid crystal driving electrode is not disposed on the upper substrate. That is, preferably the liquid crystal driving electrode is disposed only on the lower substrate.

The shape of the pixel electrode is not particularly limited, but one of preferable aspects of the present invention is that the pixel electrode has a slit as described above. One of preferable aspects of the present invention is that the pixel electrode has a comb shape. In the present description, the electrode having the comb shape is not referred to as the electrode in which the slit is provided, but is referred to as a comb-shaped electrode.

The liquid crystal display device of the present invention is preferably configured to switch between a first driving system that performs the driving operation and a second driving system that performs a driving operation to generate an electric field rotating the liquid crystal molecules in one direction in the horizontal plane with respect to the main surfaces of the upper and lower substrates using the electrode. The rotation in one direction may be performed as long as the rotation can substantially be performed in one direction. The generation of the electric field using the electrode may be any method for generating the electric field using at least one electrode selected from the pixel electrode, the first auxiliary capacitance electrode, and the second auxiliary capacitance electrode. For example, preferably the electric field is generated to rotate the liquid crystal molecules by applying the voltage to the pixel electrode during the white display, and the electric field is weakened (turned off) to reversely rotate the liquid crystal molecules by decreasing the voltage applied to the pixel electrode during the black display.

The configuration of the liquid crystal display device of the present invention is not particularly limited by other components, but other configurations usually used for a liquid crystal display device can appropriately be applied.

Advantageous Effects of Invention

According to the liquid crystal display device of the present invention, the dot inversion driving can be performed and the generation of the flicker can be suppressed.

BRIEF DESCRIPTION OF DRAWINGS

FIG. 10 is a view illustrating the voltage applied to each electrode in a certain frame during the white display of the first driving system in the liquid crystal display device of Embodiment 1.

FIG. 14 is a view illustrating the voltage applied to each electrode in a certain frame during the white display of the first driving system in the liquid crystal display device of Embodiment 2.

FIG. 22 is a view illustrating the voltage applied to each electrode in a certain frame during white display in the liquid crystal display device of Comparative Example 1.

DESCRIPTION OF EMBODIMENTS

Figure 1:
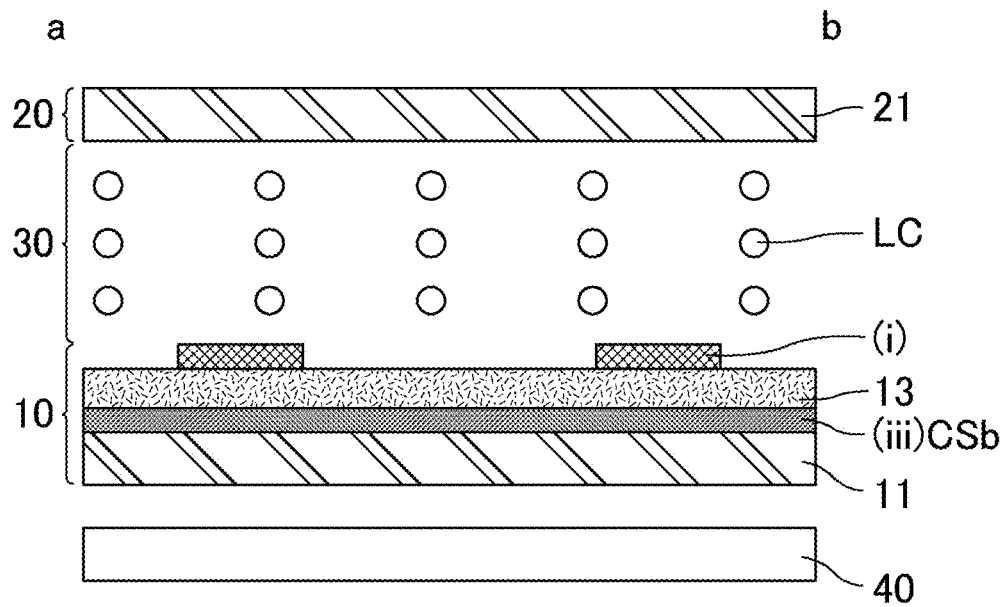
FIG. 1 is a schematic sectional view illustrating a section of a liquid crystal display device of Embodiment 1, and illustrating a section of a portion corresponding to a line segment a-b indicated by a one dot chain line in FIG. 2.

Embodiments of the present invention will be described in detail below with reference to the drawings, but the present invention is not limited to only these embodiments. In the present description, a pixel may be a sub-pixel unless otherwise stated. The sub-pixel means a region illustrating any monochromatic color such as R (red), G (green), B (blue) or yellow (Y). Paired substrates between which the liquid crystal layer is sandwiched are also referred to as an upper substrate and a lower substrate. One of the substrates which is on a display surface side is referred to as an upper substrate, and the other of the substrates on an opposite side of the display surface is referred to as a lower substrate. Among electrodes arranged on the substrate, an electrode on the display surface side is referred to as an upper-layer electrode, and an electrode on the opposite side of the display face side is referred to as a lower-layer electrode.

In each embodiment, a member or a portion that exhibits a similar function is denoted by the same reference numeral. In the drawings, unless otherwise stated, (i) illustrates a slit electrode as a pixel electrode on an upper layer (liquid crystal layer side) of the lower substrate, (ii) illustrates a comb-shaped electrode as an auxiliary capacitance electrode in a lower layer (opposite side of the liquid crystal layer side) of the lower substrate, and (iii) illustrates a comb-shaped electrode as another auxiliary capacitance electrode in the lower layer of the lower substrate. In the drawings, a double-headed arrow indicated by a broken line indicates a line of electric force. The layers, such as a color filter and a black matrix, which do not relate to electric field control of the liquid crystal are omitted.

In the present description, the electrode of the lower substrate means at least one of the upper-layer electrode (i), the lower-layer electrode (ii), and the lower-layer electrode (iii).

In the present specification, the slit electrode means an electrode in which a slit is provided, and usually includes a plurality of linear electrode portions.

In the present specification, rise means a period during which a display state changes from a dark state (black display) to a bright state (white display). Fall means a period during which the display state changes from the bright state (white display) to the dark state (black display). Initial alignment of liquid crystal means alignment of liquid crystal molecules when voltage is not applied (during the black display).

The upper-layer electrode (i), the lower-layer electrode (ii), and the lower-layer electrode (iii) can usually be set to a different potential higher than a threshold voltage. In the present description, the threshold voltage means a voltage value giving transmittance of 5% when the transmittance in the bright state is set to 100%. The term "capable of being set to the different potential higher than the threshold voltage" means that the different potential can perform a driving operation to set the potential to the different potential higher than the threshold voltage, whereby an electric field applied to the liquid crystal layer can preferably be controlled. As to a configuration capable of being set to the different potential, for example, when the upper-layer electrode (i) is a pixel electrode while the lower-layer electrode (ii) and the lower-layer electrode (iii) are the auxiliary capacitance electrode, a TFT (thin-film transistor element) is connected to the upper-layer electrode (i), an alternating voltage (AC voltage) is applied to perform alternating drive (AC drive) of the liquid crystal by changing the voltage value, and the alternating voltage is applied to the lower-layer electrode (ii) and the lower-layer electrode (iii) to perform the AC drive with another TFT, the AC voltage is applied to the lower-layer electrode (ii) and the lower-layer electrode (iii), which are commonly connected in each line or all the pixels, with TFTs corresponding to the line or all the pixels to perform the AC drive of the liquid crystal, the AC drive may be performed on a line or all pixels with no use of the TFT, or a direct-current voltage (DC voltage) may be applied to the lower-layer electrode (ii) and the lower-layer electrode (iii) with no use of the TFT to perform direct-current drive (DC drive) of the liquid crystal.

In a first driving system in the present embodiment, an AC voltage having a constant amplitude is applied to the lower-layer electrode (ii) and the lower-layer electrode (iii) with the polarity inversion. In a second driving system, a DC voltage having a constant potential (for example, 0 V) is applied. The upper-layer electrode (i) is connected to the TFT, the voltage is applied to the upper-layer electrode (i) by a source driver, and gray scale display is performed by changing the voltage in both the first driving system and the second driving system. Polarity inversion timing of the voltage to the electrodes of the upper-layer electrode (i), the lower-layer electrode (ii), and the lower-layer electrode (iii) is not necessarily simultaneous, but is preferably simultaneous.

Examples of the cases that liquid crystal display devices of the prior art example (Comparative Example 1) and the present invention (Embodiments 1 to 6) are driven by the first driving system will mainly be described below.

(Embodiment 1)

FIG. 1 is a schematic sectional view illustrating a section of a liquid crystal display device of Embodiment 1. FIG. 1 illustrates a section of a portion corresponding to a line segment a-b indicated by a one dot chain line in FIG. 2 (to be described later).

In the liquid crystal display device of Embodiment 1 include, as illustrated in FIG. 1, a backlight 40, a lower substrate 10, a liquid crystal layer 30, and an upper substrate 20 are stacked in this order from a back side of the liquid crystal display device toward an observation surface side.

In the liquid crystal display device of Embodiment 1, as illustrated in FIG. 1, liquid crystal molecules LC are horizontally aligned when the potential difference between the electrodes of the upper and lower substrates is less than the threshold voltage (in FIG. 1, the liquid crystal molecules LC are aligned forward from a back of a section).

The lower-layer electrode (ii) (not illustrated in FIG. 1, but illustrated in FIG. 2) and the lower-layer electrode (iii) of the lower substrate 10 are the comb-shaped electrode as described above, and the upper-layer electrode (i) that is the slit electrode is disposed on the lower-layer electrode (ii) and the lower-layer electrode (iii) with an insulating layer 13 interposed therebetween. An auxiliary capacitance exists between the upper-layer electrode (i) and the lower-layer electrode (ii), and between the upper-layer electrode (i) and the lower-layer electrode (iii). An electrode for liquid crystal driving is not provided on the upper substrate 20, but an electrode for liquid crystal driving is provided only in the lower substrate 10.

For example, the insulating layer 13 can be made of a nitride film SiN, an oxide film $SiO_2$, an acrylic resin, and a combination thereof.

A horizontal alignment film (not illustrated) is provided on the liquid crystal layer side of each of the upper and lower substrates, and the liquid crystal molecules are horizontally aligned when the voltage is not applied. The horizontal alignment film is not particularly limited as long as the horizontal alignment film allows the liquid crystal molecules to be aligned horizontally with respect to the film surface. Examples of the horizontal alignment film include an alignment film (for example, an alignment film having a dielectric constant $\varepsilon=3$ to 4) made of an organic material, an alignment film (for example, an alignment film having a dielectric constant $\varepsilon=5$ to 7) made of an inorganic material, a photo alignment film made of an optically active material, and an alignment film subjected to alignment treatment by rubbing or the like. The alignment film may be an alignment film that is not subjected to alignment treatment by rubbing treatment or the like. Using an alignment film, such as an alignment film made of an organic material, an alignment film made of an inorganic material, and a photo alignment film, in which necessity of the alignment treatment is eliminated, the cost can be reduced by simplifying the process, and reliability and yield can be improved. In the case that the rubbing treatment is performed, liquid crystal contamination due to impurity contamination by a rubbing cloth or the like, a point defect due to a foreign matter, and display unevenness due to uneven rubbing in a liquid crystal panel are possibly generated. However, these disadvantages can also be eliminated.

The liquid crystal includes liquid crystal molecules that are aligned in a horizontal direction with respect to a main surface of the substrate when the voltage is not applied. The alignment in the horizontal direction with respect to the main surface of the substrate means that the liquid crystal molecules are aligned in the substantially horizontal direction with respect to the main surface of the substrate in the technical field of the present invention. Preferably the liquid crystal is substantially constructed with the liquid crystal molecules that are aligned in the horizontal direction with respect to the main surface of the substrate when the voltage is not applied. Such a horizontal alignment type liquid crystal is an advantageous system that obtains characteristics such as a wide viewing angle.

The liquid crystal material in the liquid crystal layer 30 in the liquid crystal display device of Embodiment 1 has the positive anisotropy of dielectric constant. As described above, one of preferable aspects of the present invention is that the liquid crystal layer contains liquid crystal molecules having positive anisotropy of dielectric constant. The liquid crystal molecules having positive dielectric constant anisotropy are aligned in a certain direction when the electric field is applied. For the liquid crystal molecules having positive anisotropy of dielectric constant, the alignment control is easily performed, and higher-speed response can be achieved. Preferably anisotropy of dielectric constant $\Delta\varepsilon$ of the liquid crystal is greater than or equal to 1, more preferably is greater than or equal to 1.5, and still more preferably is greater than or equal to 2. Preferably the anisotropy of dielectric constant $\Delta\varepsilon$ of the liquid crystal is less than or equal to 30, more preferably is less than or equal to 20, and still more preferably is less than or equal to 10. In the present description, the anisotropy of dielectric constant $\Delta c$ of the liquid crystal is measured by an LCR meter.

In Embodiment 1, preferably an average thickness (cell gap) $d_{LC}$ of the liquid crystal layer 30 ranges from 1 µm to 8 µm. More preferably the average thickness $d_{LC}$ ranges from 2 µm to 5 µm.

In the present description, the average thickness $d_{LC}$ of the liquid crystal layer means a value calculated by averaging the thickness of the entire liquid crystal layer in the liquid crystal display device.

Preferably $d_{LC} \times \Delta n$ is greater than or equal to 100 nm, more preferably is greater than or equal to 150 nm, and still more preferably is greater than or equal to 200 nm. Preferably $d_{LC} \times \Delta n$ is less than or equal to 550 nm, more preferably is less than or equal to 500 nm or less, and still more preferably is less than or equal to 450 nm.

Figure 2:
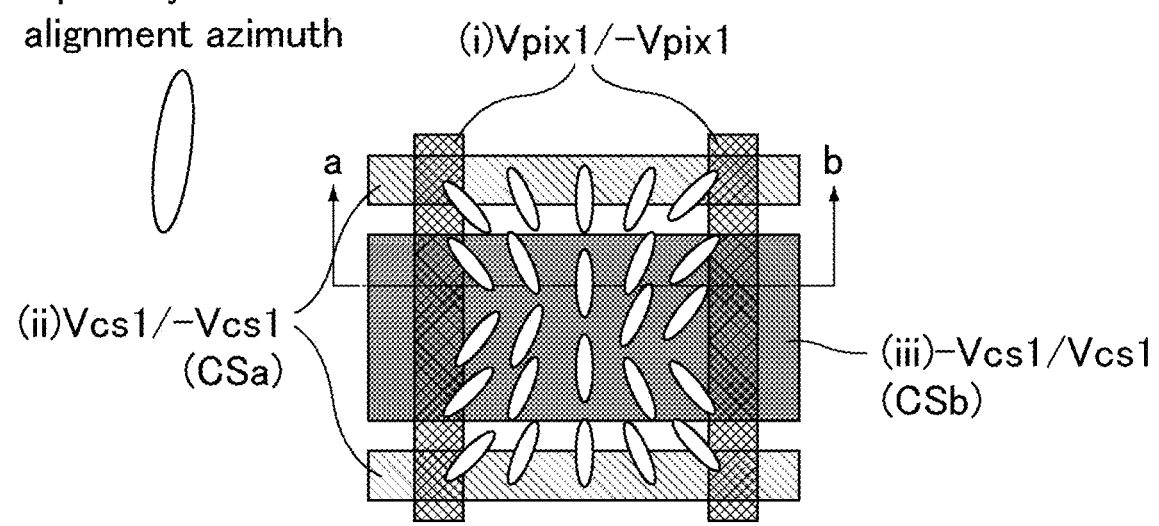
FIG. 2 is a schematic plan view illustrating voltage applied to each electrode and alignment of liquid crystal molecules during white display of a first driving system of Embodiment 1.

FIG. 2 is a schematic plan view illustrating the voltage applied to each electrode and the alignment of the liquid crystal molecules during the white display of the first driving system of Embodiment 1. FIG. 2 illustrates a portion corresponding to a portion surrounded by a broken line of a pixel (4) in FIG. 8 (to be described later).

The upper-layer electrode (i) includes a plurality of linear electrode portions in a plan view of the main surface of the substrate. The plurality of linear electrode portions is substantially parallel to each other, and slits substantially parallel to each other are provided between the linear electrode portions. In this way, one of the preferable aspects of the present invention is that the slit is provided in the upper-layer electrode (i). The upper-layer electrode (i) may be a comb-shaped electrode instead of the slit electrode. One of the preferable aspects of the present invention is that the upper-layer electrode (i) has the comb shape.

Each of the lower-layer electrode (ii) and the lower-layer electrode (iii) is constructed with a trunk and a branch extending from the trunk in a plan view of the main surface of the substrate. The branch is a plurality of linear electrode portions substantially parallel to each other. FIG. 2 illustrates the branch. In this way, one of the preferable aspects of the present invention is that the lower-layer electrode (ii) and the lower-layer electrode (iii) are formed in to the comb shape.

As described above, preferably each of the upper-layer electrode (i), the lower-layer electrode (ii), and the lower-layer electrode (iii) includes the linear portion.

The structures of the upper-layer electrode (i), the lower-layer electrode (ii) and the lower-layer electrode (iii) in FIG. 2 are merely an example. The present invention is not limited to this shape, but electrodes having various structures can be used.

In FIG. 2, the extending direction of each of the lower-layer electrode (ii) and the lower-layer electrode (iii) is set to a direction forming an angle of 90° with respect to the extending direction of the upper-layer electrode (i). However, it is not limited to 90° in Embodiment 1. Preferably the extending direction of each branch of the lower-layer electrode (ii) and the lower-layer electrode (iii) ranges from 30° to 90° with respect to the extending direction of the linear portion of the upper-layer electrode (i), more preferably ranges from 45° to 90°, still more preferably ranges from 60° to 90°, and particularly preferably ranges from 75° to 90°. With such an electrode structure, a response time can be shortened during the rise and the fall.

In the upper-layer electrode (i), preferably an electrode width L of the linear portion ranges from 2 µm to 7 µm. Preferably an electrode interval S1 between the linear portions adjacent to each other ranges from 2 µm to 14 µm. Preferably a ratio (L/S1) of the electrode width L and the electrode interval S1 ranges from 0.1 to 1.5. More preferably a lower limit of the ratio L/S1 is 0.2, and an upper limit is 0.8.

In Embodiment 1, the average electrode width of the linear portion varies in pixels in the branch of a pair of comb-shaped electrodes constructed with the lower-layer electrode (hereinafter, also simply referred to as a lower-layer electrode forming auxiliary capacitance CSa) forming the auxiliary capacitance CSa between the lower-layer electrode and the upper-layer electrode (i) and the lower-layer electrode (hereinafter, also referred to as a lower-layer electrode forming auxiliary capacitance CSb) forming the auxiliary capacitance CSb between the lower-layer electrode and the upper-layer electrode (i). The average electrode width of the linear portion in the lower-layer electrode forming the auxiliary capacitance CSa is narrow, and the average electrode width of the linear portion in the lower-layer electrode forming the auxiliary capacitance CSb is wide.

As the lower-layer electrode (ii) electrically connected to a group of auxiliary capacitance lines CS1m (illustrated in FIGS. 8 and 9 to be described later, m represents the number of rows of pixels arranged in a matrix and is an integer) disposed on a lower side of a pixel line, the lower-layer electrode forming the auxiliary capacitance CSa and the lower-layer electrode forming the auxiliary capacitance CSb are alternately arranged in the pixels vertically and horizontally adjacent to each other. As the lower-layer electrode (iii) electrically connected to a group of auxiliary capacitance lines CS2*m* (illustrated in FIGS. 8 and 9, m represents the number of rows of the pixels arranged in the matrix and is an integer) disposed on an upper side of the pixel line, the lower-layer electrode forming the auxiliary capacitance CSa and the lower-layer electrode forming the auxiliary capacitance CSb are alternately arranged in the pixels vertically and horizontally adjacent to each other. With such a configuration, the effect of Embodiment 1 can be exerted.

For example, preferably an average electrode width L1 of the narrower average width ranges from 1 µm to 3 µm. Preferably an average electrode width L2 of the larger average width ranges from 5.5 µm to 13 µm.

Preferably the electrode interval S between the linear portions adjacent to each other is greater than or equal to 2 µm, and is less than or equal to 7 µm. Preferably a ratio (L1/S) of the average electrode width L1 and the average electrode interval S ranges from 0.1 to 5. More preferably the lower limit of the ratio L1/S is 0.15, still more preferably is 0.2, and particularly preferably is 0.25. More preferably the upper limit of the ratio L1/S is 3, more preferably is 2, and particularly preferably is 1.5. A ratio (L2/S) of the average electrode width L2 and the average electrode interval S is not particularly limited as long as the ratio L2/S is larger than the ratio L1/S, but preferably the ratio L2/S ranges from 1 to 10. More preferably the lower limit of the ratio L2/S is 1.5, still more preferably is 2, and particularly preferably is 2.5. More preferably the upper limit of the ratio L2/S is 9, still more preferably is 8, and particularly preferably is 7. The electrode intervals S1 and S2 in each of the upper-layer electrode (i), the lower-layer electrode (ii), and the lower-layer electrode (iii) are usually substantially equal to each other in the pixel, but the electrode intervals S1 and S2 may be different from each other in the pixel.

As illustrated in FIG. 2, the linear electrode portion of the branch included in the lower-layer electrode (ii) of the lower substrate is disposed between the linear electrode portions of the branch included in the lower-layer electrode (iii).

Figure 8:
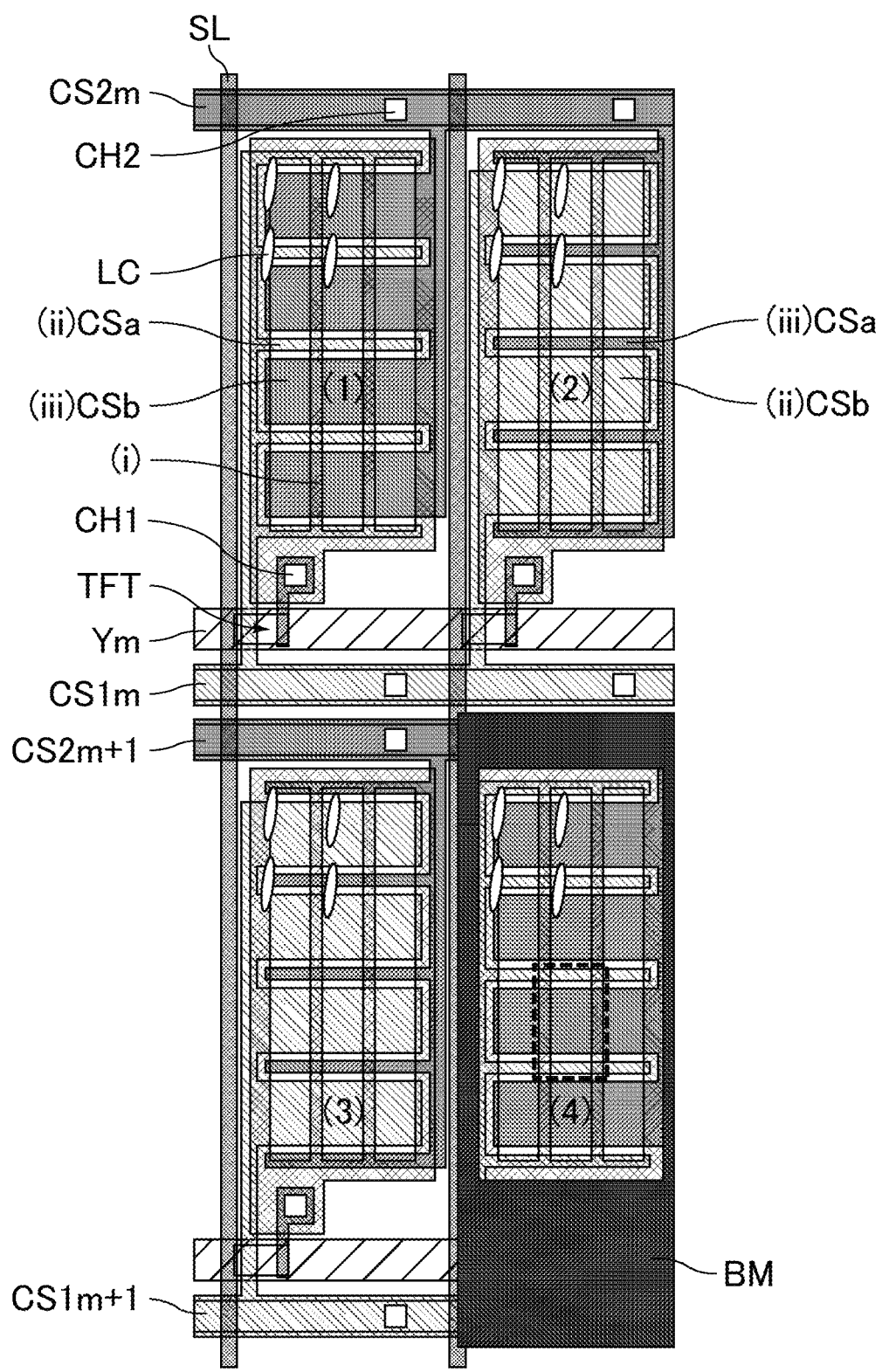
FIG. 8 is a schematic plan view illustrating an example of a pixel layout of the liquid crystal display device of Embodiment 1.

The electrodes (the upper-layer electrode (i), the lower-layer electrode (ii), and the lower-layer electrode (iii)) of each layer are disposed in a positional relationship in FIGS. 2 and 8. In this way, one of preferable aspects of the present invention is that the slit is provided in the upper-layer electrode (i) of the lower substrate and the lower-layer electrode (ii) and the lower-layer electrode (iii) of the lower substrate have the comb shape. One of preferable aspects of the present invention is that the upper-layer electrode (i), the lower-layer electrode (ii), and the lower-layer electrode (iii) have the comb shape.

In Embodiment 1, two linearly polarizing plates having the polarization axes in FIG. 1 are used. In Embodiment 1, one linearly polarizing plate is disposed on outsides (on the opposite side of the liquid crystal layer side) of the upper and lower substrates. The linearly polarizing plates are arranged in crossed Nicols in which the polarizing axes of the linearly polarizing plates of the upper and lower substrates are perpendicular or parallel to a major axis (an initial alignment orientation of the liquid crystal molecules) of the liquid crystal molecules when the voltage is not applied, thereby forming a normally black mode liquid crystal display device. In this way, preferably each of the upper and lower substrates has the linearly polarizing plate.

A liquid crystal driving method in which the liquid crystal display device of Embodiment 1 is used will be described below.

In Embodiment 1, the high-speed response drive can be performed. By switching a voltage application method, two kinds of drive of the high-speed response drive and drive that achieves higher transmittance than that of the high-speed response drive with the same configuration.

In the present description, the high-speed response drive is referred to as the first driving system, and the drive that achieves the higher transmittance is referred to as the second driving system.

Both the first driving system and the second driving system change the voltage of the upper-layer electrode (i) to perform the gray scale display.

In the first driving system, voltage Vcs1 or −Vcs1 is applied to the lower-layer electrode (ii), the lower-layer electrode (iii) is set to voltage −Vcs1 or Vcs1 to always generate a lateral electric field, and voltage Vpix1 or −Vpix1 corresponding to the gray scale is applied to the upper-layer electrode (i), thereby driving the liquid crystal. In this case, a center potential of the upper-layer electrode (i) that is the pixel electrode is set to 0 V.

The center potential means an average value (intermediate value) between a maximum value and a minimum value of the AC voltage.

In the second driving system, both the lower-layer electrode (ii) and the lower-layer electrode (iii) are set to 0 V, and voltage Vpix2 or −Vpix2 corresponding to the gray scale is applied to the upper-layer electrode (i) to generate a fringe electric field between the upper-layer electrode (i) and the lower-layer electrode (ii), thereby driving the liquid crystal.

First the behavior of the liquid crystal molecules during the rise (white display) will be described in detail.

The voltage Vcs1 or −Vcs1 is applied to the lower-layer electrode (ii) with the polarity inversion, and the voltage −Vcs1 or Vcs1 is applied to the lower-layer electrode (iii) with the polarity inversion, thereby always generating the lateral electric field. An absolute value of the voltage applied to each of the lower-layer electrode (ii) and the lower-layer electrode (iii) is always constant. By applying the voltage Vpix1 or −Vpix1 to the upper-layer electrode (i) with the polarity inversion, an electric field that alternately rotates the liquid crystal molecules in different orientations in the horizontal plane is generated, and the liquid crystal molecules are aligned in a plane by the electric field so as to form bend alignment and splay alignment.

Figure 3:
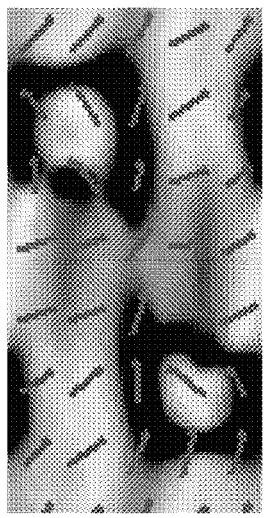
FIG. 3 is a simulation result illustrating a director distribution and a transmittance distribution corresponding to FIG. 2.

FIG. 3 is a simulation result illustrating a director distribution and a transmittance distribution corresponding to FIG. 2. As can be seen from the simulated transmittance distribution in FIG. 3, the liquid crystal molecules rotate in different orientations.

In the first driving system, the liquid crystal molecules rotate alternately in different orientations in the horizontal plane. That is, first groups of the liquid crystal molecules rotate clockwise in the horizontal plane and the second groups of the liquid crystal molecules rotate counterclockwise in the horizontal plane.

The voltage is always applied to the lower-layer electrodes (ii), (iii), so that the strong electric field is applied to the whole region in the horizontal plane during rise response. Consequently, the speed of the rise response is enhanced.

Preferably a potential difference between the upper-layer electrode (i) and the lower-layer electrode (ii) is less than or equal to 12 V or less, more preferably is less than or equal to 11 V, and still more preferably is less than or equal to 10 V. The same holds true for the preferable potential difference between the upper-layer electrode (i) and the lower-layer electrode (iii).

During the fall (black display), by weakening the voltage applied to the upper-layer electrode (i), the liquid crystal molecules react with the lateral electric field generated by the lower-layer electrode (ii) and the lower-layer electrode (iii), and rotate forcedly to the initial alignment orientation by the electric field. At the same time, restoring force of the liquid crystal molecules that were bend alignment and splay alignment in the horizontal plane during the white display also acts to further accelerate the response.

Figure 4:
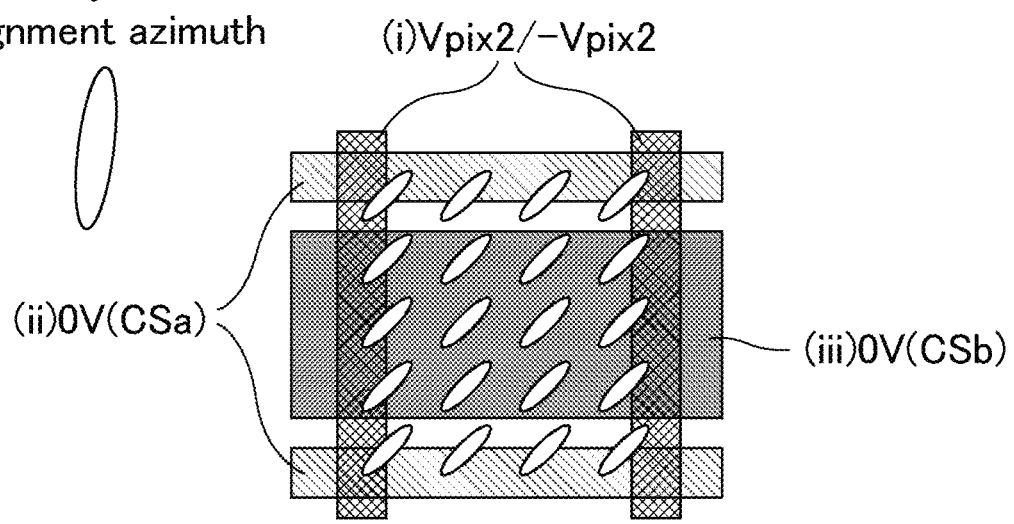
FIG. 4 is a schematic plan view illustrating the voltage applied to each electrode and the alignment of the liquid crystal molecules during the white display of a second driving system of Embodiment 1.
Figure 5:
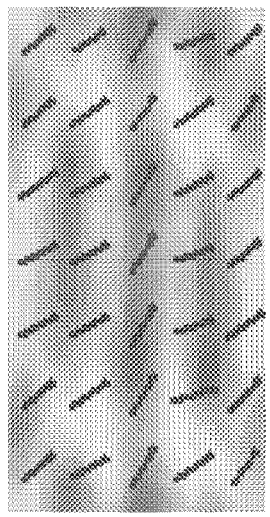
FIG. 5 is a simulation result illustrating the director distribution and the transmittance distribution corresponding to FIG. 4.

FIG. 4 is a schematic plan view illustrating the voltage applied to each electrode and the alignment of the liquid crystal molecules during the white display of the second driving system of Embodiment 1. FIG. 4 illustrates a portion corresponding to the portion surrounded by the broken line of the pixel (4) in FIG. 8. FIG. 5 is a simulation result illustrating the director distribution and the transmittance distribution corresponding to FIG. 4.

First the behavior of the liquid crystal molecules during the rise (white display) will be described in detail.

Both the lower-layer electrode (ii) and the lower-layer electrode (iii) are set to 0 V, the voltage Vpix2 or −Vpix2 is applied to the upper-layer electrode (i) with the polarity inversion to generate the fringe electric field between the upper-layer electrode (i) and the lower-layer electrodes (ii), (iii), and the liquid crystal molecules rotate in the same orientation in response to the fringe electric field. As can be seen from the simulated transmittance distribution diagram (FIG. 5), as the liquid crystal molecules rotate in the same orientation, the transmittance higher than that of the first driving system is obtained as a whole by the rotation of the liquid crystal molecules in the same orientation.

During the white display of the second driving system, the potential at the upper-layer electrode (i) varies depending on the display. Preferably the upper limit of the potential is 10 V, more preferably is 9 V, still more preferably is 8 V.

The potentials at the lower-layer electrode (ii), (iii) may be set less than the threshold voltage.

During the fall (black display), when the voltage applied to the upper-layer electrode (i) is turned off, the liquid crystal molecules rotate so as to return toward an alignment treatment orientation (anchoring) by the restoring force of the liquid crystal molecules.

Figure 6:
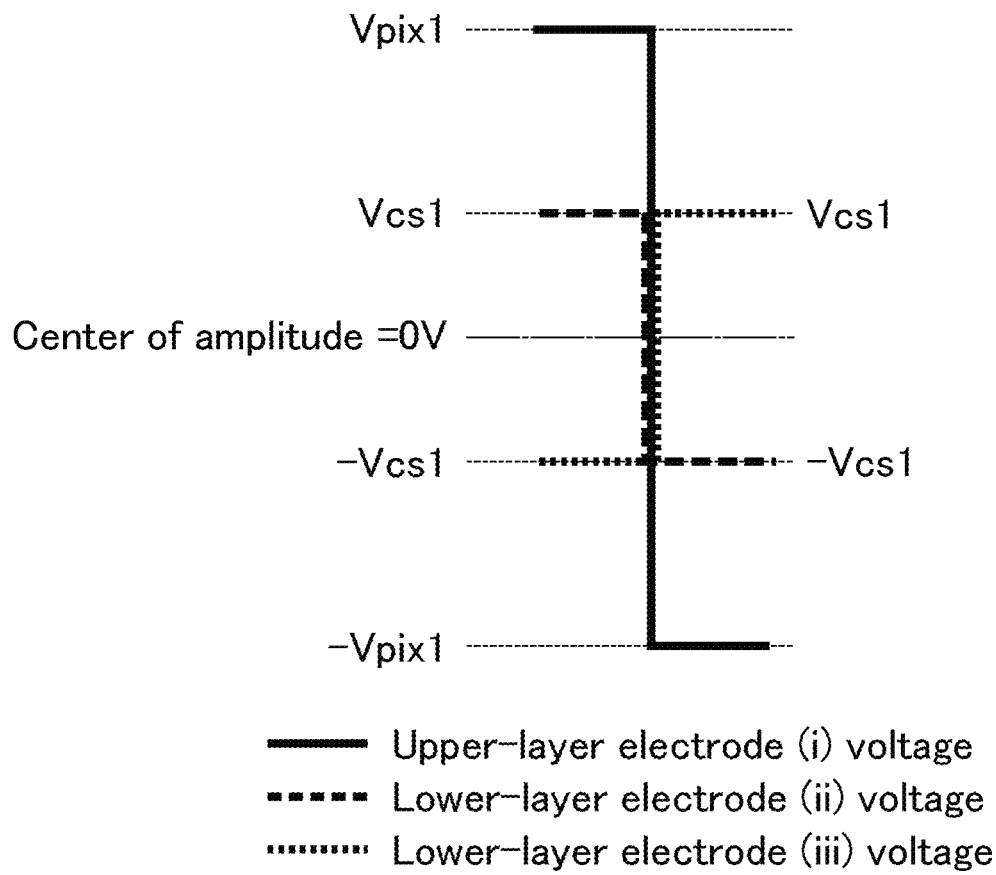
FIG. 6 is a voltage relationship diagram illustrating the voltage applied to each electrode during the white display of the first driving system of Embodiment 1.
Figure 7:
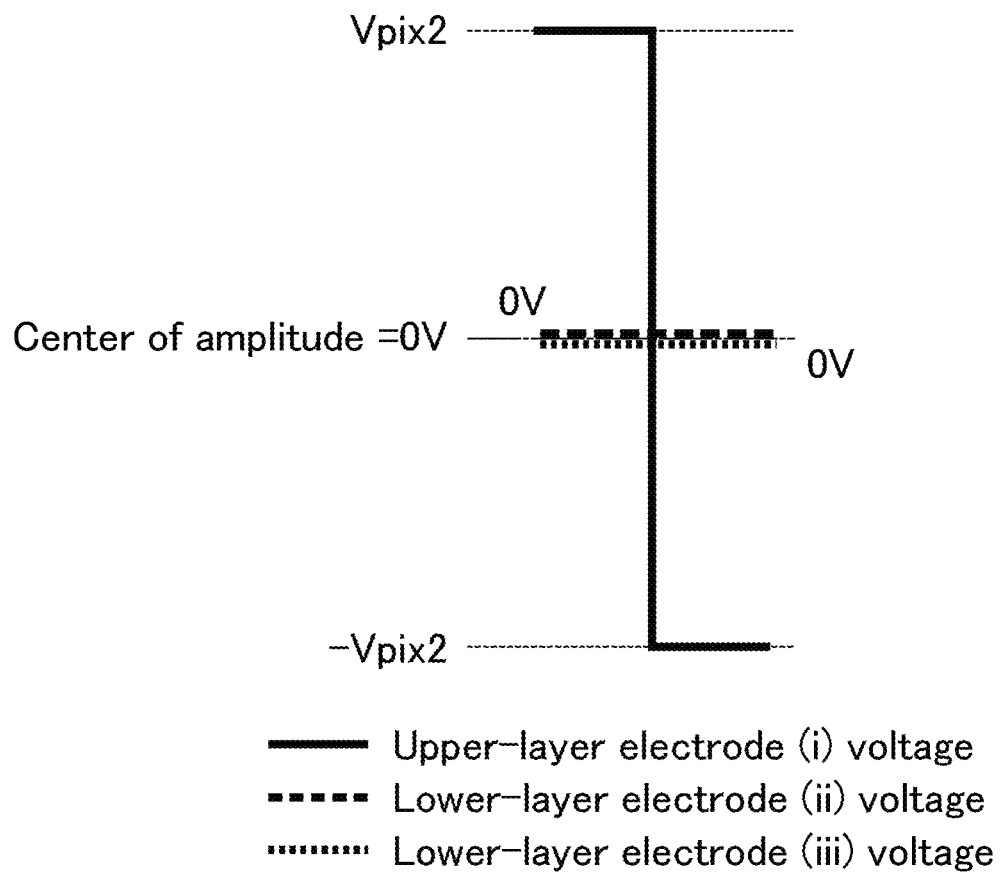
FIG. 7 is a voltage relationship diagram illustrating the voltage applied to each electrode during the white display of the second driving system of Embodiment 1.

FIG. 6 is a voltage relationship diagram illustrating the voltage applied to each electrode during the white display of the first driving system of Embodiment 1. FIG. 7 is a voltage relationship diagram illustrating the voltage applied to each electrode during the white display of the second driving system of Embodiment 1.

Figure 9:
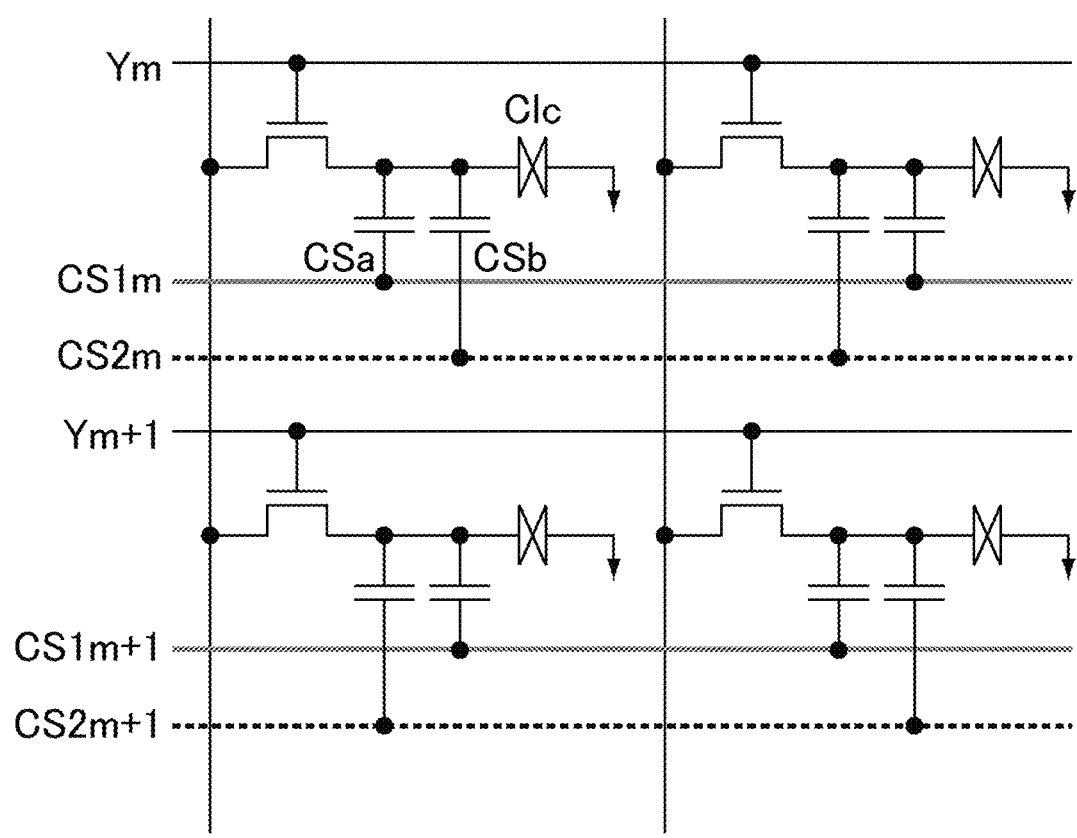
FIG. 9 is a view illustrating an equivalent circuit of a pixel in the liquid crystal display device of Embodiment 1.

FIG. 8 is a schematic plan view illustrating an example of a pixel layout of the liquid crystal display device of Embodiment 1. FIG. 8 is by way of example, but the electrode structure, the line, and the like are not limited to the shapes in FIG. 8. FIG. 9 is a view illustrating an equivalent circuit of the pixel in the liquid crystal display device of Embodiment 1.

The upper-layer electrode (i) is electrically connected to a drain electrode extending from the thin-film transistor element TFT through a contact hole CH1. At the timing selected by a scanning signal line Ym, the voltage supplied from the source driver through the data signal line SL is applied to the upper-layer electrode (i) that drives the liquid crystal through the thin-film transistor element TFT. A contact hole CH2 electrically connects the auxiliary capacitance line CS2$m$ and the lower-layer electrode (iii).

In Embodiment 1, two auxiliary capacitance lines are disposed in each horizontal line, and it is assumed that CS1$m$ and CS2$m$ are two storage capacitance lines arranged corresponding to the mth-row pixel line.

Embodiment 1 differs from Comparative Example 1 (to be described later) in the following two points.

(1) In Embodiment 1, as the lower-layer electrode electrically connected to the group of auxiliary capacitance lines arranged alternately every other when viewed in the direction perpendicular to the auxiliary capacitance line, the lower-layer electrode forming the auxiliary capacitance CSa and the lower-layer electrode forming the auxiliary capacitance CSb are alternately arranged in the pixels vertically and laterally adjacent to each other. The width of the branch of the comb-shaped lower-layer electrode forming the auxiliary capacitance CSa is narrow, and the width of the branch of the comb-shaped lower-layer electrode forming the auxiliary capacitance CSb is wide. For example, as the lower-layer electrode electrically connected to a group of auxiliary capacitance lines CS1$m$ (m represents the number of rows of the pixels arranged in the matrix and is an integer) arranged on the lower side of the pixel line, the lower-layer electrode forming the auxiliary capacitance CSa and the lower-layer electrode forming the auxiliary capacitance CSb are alternately arranged in the pixels vertically and horizontally adjacent to each other. As the lower-layer electrode electrically connected to a group of auxiliary capacitance lines CS1$m$ (m represents the number of rows of the pixels arranged in the matrix and is an integer) arranged on the upper side of the pixel line, the lower-layer electrode forming the auxiliary capacitance CSa and the lower-layer electrode forming the auxiliary capacitance CSb are alternately arranged in the pixels vertically and horizontally adjacent to each other.

(2) In Embodiment 1, the voltage (in this case, Vcs 1) having the same magnitude is applied to the lower-layer electrode forming the auxiliary capacitance CSa and the lower-layer electrode forming the auxiliary capacitance CSb with the polarity inversion (the center potential at the pixel electrode is assumed to be 0 V).

Consequently, the relationship between the potential difference |Vpix1−Vcs1| between the pixel electrode (i) and the narrow lower-layer electrode and the potential difference |Vpix1+Vcs1| between the pixel electrode (i) and the wide comb-shaped electrode becomes identical in each pixel even if the dot inversion drive is performed. As a result, the same luminance can be obtained at the same gray scale in all the pixels. Thus, excellent display quality can be achieved by the dot inversion drive, and the generation of the flicker can be prevented as compared with Comparative Example 1 in which the line inversion drive is performed.

Figure 11:
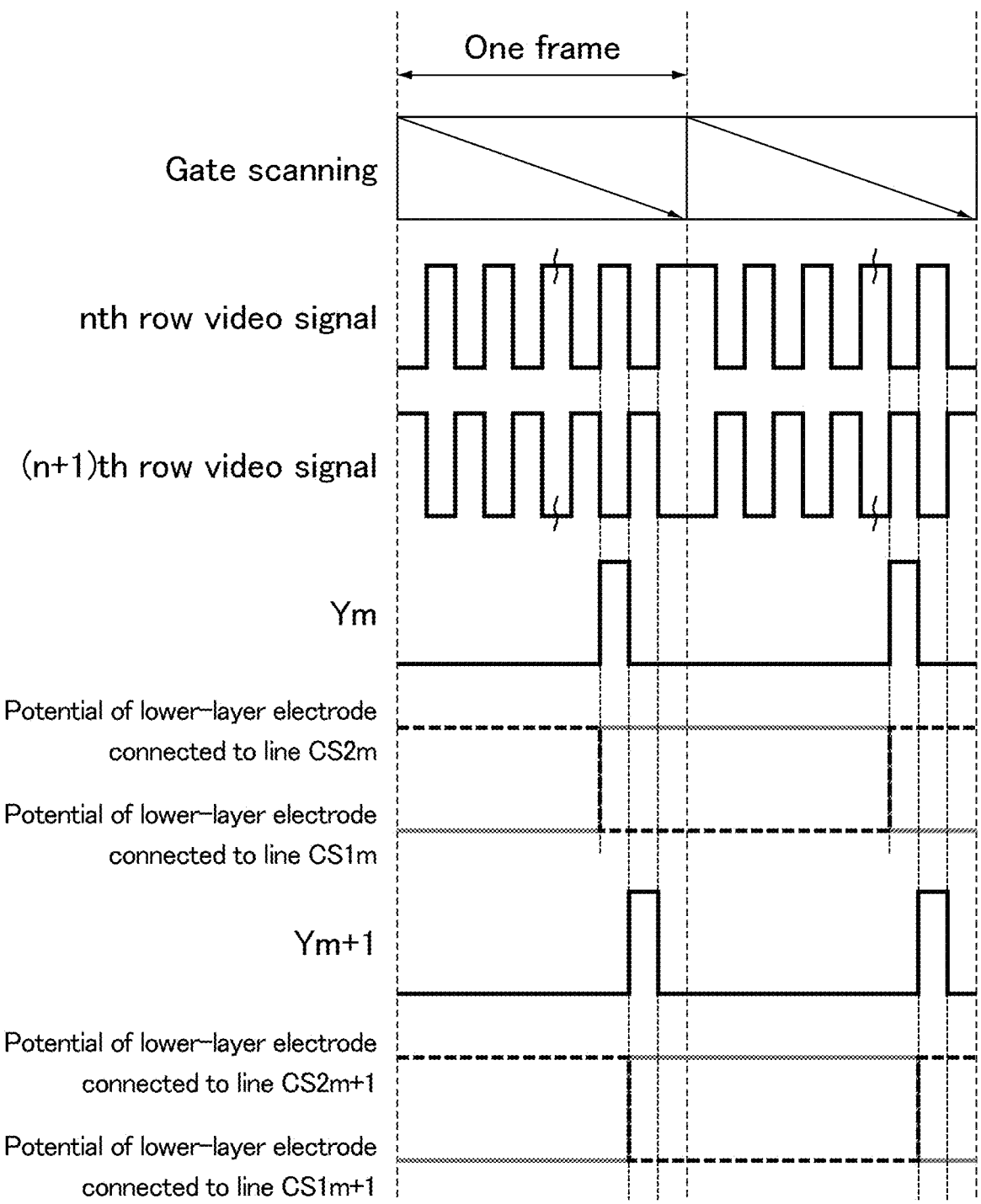
FIG. 11 is a time series diagram illustrating the voltage applied to each electrode during the white display of the first driving system in the liquid crystal display device of Embodiment 1.

FIG. 10 is a view illustrating the voltage applied to each electrode in a certain frame during the white display of the first driving system in the liquid crystal display device of Embodiment 1. In FIG. 10, the pixel means the upper-layer electrode (i), CSa means the lower-layer electrode forming the capacitance CSa, and CSb means the lower-layer electrode forming the capacitance CSb. FIG. 11 is a time series diagram illustrating the voltage applied to each electrode during the white display of the first driving system in the liquid crystal display device of Embodiment 1.

In this driving method, the lower-layer electrodes (ii), (iii) may be formed as a common electrode in each line.

The points of Embodiment 1 are as follows.

Two auxiliary capacitance lines are disposed in each horizontal line (pixel line). As the lower-layer electrode (ii) electrically connected to the group of auxiliary capacitance lines arranged on the lower side of the pixel line, the lower-layer electrode forming the auxiliary capacitance CSa and the lower-layer electrode forming the auxiliary capacitance CSb are alternately arranged in each row and each column. As the lower-layer electrode (iii) electrically connected to the group of auxiliary capacitance lines arranged on the upper side of the pixel line, the lower-layer electrode forming the auxiliary capacitance CSa and the lower-layer electrode forming the auxiliary capacitance CSb are alternately arranged in each row and each column.

Two auxiliary capacitance lines are arranged in each horizontal line (this point is identical to that of Comparative Example 1), and the polarity of the voltage at the auxiliary capacitance line of each horizontal line is inversed at the timing a gate voltage at the line becomes the maximum.

From the viewpoint of a transmittance improvement effect, a thin-film transistor element including an oxide semiconductor is preferably used for the thin-film transistor element in the liquid crystal display device of Embodiment 1. An oxide semiconductor exhibits carrier mobility higher than that of amorphous silicon. Consequently, a transistor area occupying one pixel can be reduced, so that an aperture ratio can be increased to enhance the transmittance per pixel. Thus, the use of the thin-film transistor element including the oxide semiconductor can notably obtain the transmittance improvement effect that is the effect of the present invention. That is, the lower substrate includes the thin-film transistor element, and the thin-film transistor element preferably includes the oxide semiconductor.

The upper and lower substrates included in the liquid crystal display device of Embodiment 1 are usually the pair of substrates between which the liquid crystal is sandwiched. For example, the line, the electrode, the color filter, and the like are formed as required while an insulating substrate is made of glass, resin or the like as a matrix, thereby forming the upper and lower substrates.

The liquid crystal display device of Embodiment 1 can appropriately include a member (such as a light source) included in the typical liquid crystal display device. The liquid crystal display device of Embodiment 1 preferably drives the liquid crystal by an active matrix driving method. The same holds true for the following embodiments.

The liquid crystal display device of Embodiment 1 can be applied to any one of a transmissive type liquid crystal display device, a reflective type liquid crystal display device, and a transflective type liquid crystal display device. The same holds true for the following embodiments.

(Embodiment 2)

Figure 12:
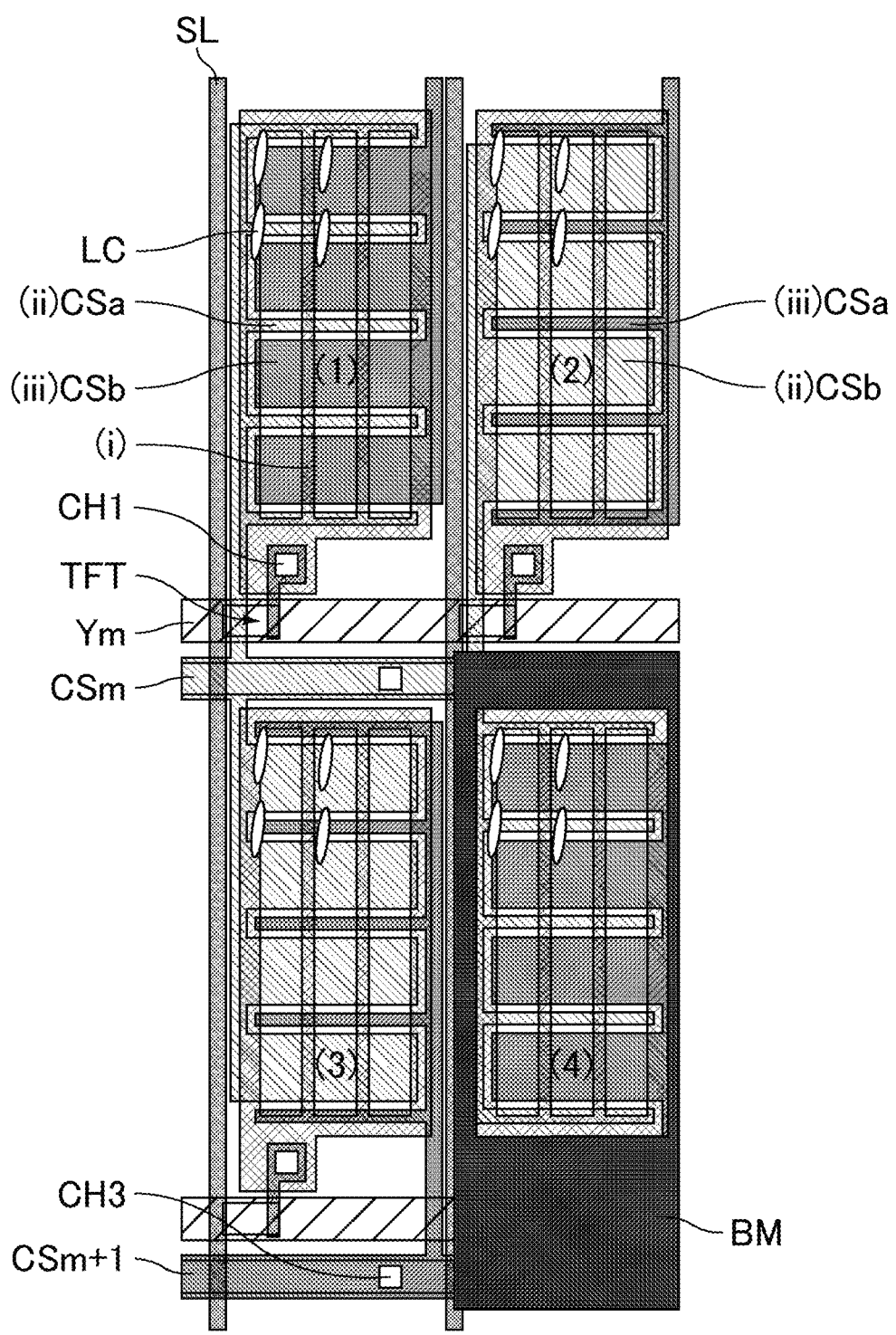
FIG. 12 is a schematic plan view illustrating an example of a pixel layout of a liquid crystal display device of Embodiment 2.
Figure 13:
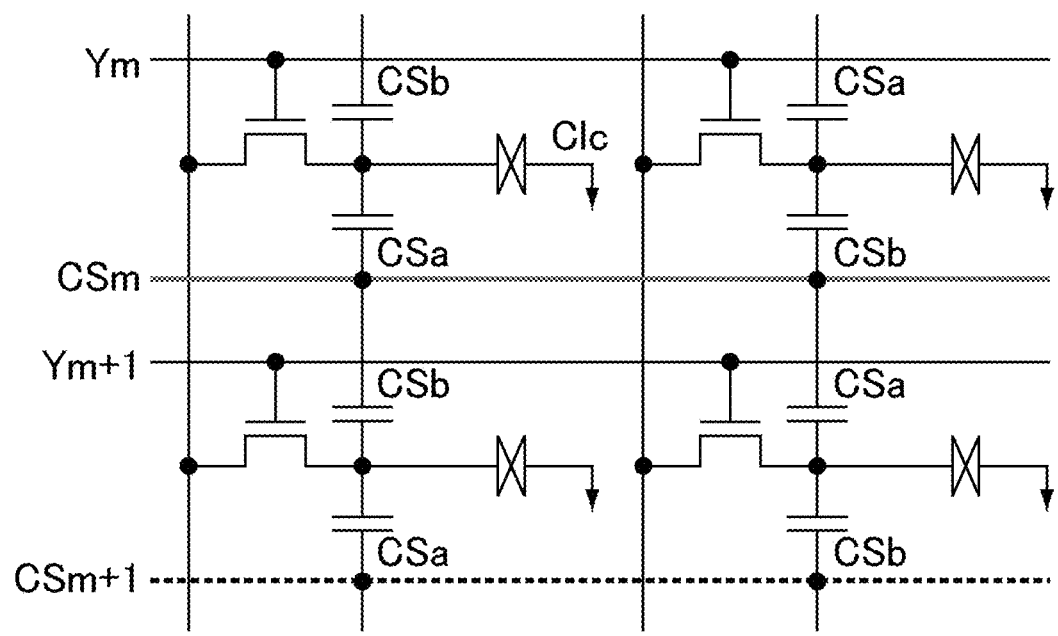
FIG. 13 is a view illustrating an equivalent circuit of a pixel in the liquid crystal display device of Embodiment 2.

FIG. 12 is a schematic plan view illustrating an example of a pixel layout of a liquid crystal display device of Embodiment 2. FIG. 13 is a view illustrating an equivalent circuit of a pixel in the liquid crystal display device of Embodiment 2.

The voltage applied to each electrode in a certain frame during the white display is similar to that of Embodiment 1 (FIG. 10). An auxiliary capacitance line corresponding to each scanning signal line is disposed and connected to a lower-layer electrode (ii) or (iii) at a contact hole. It is assumed that CSm is the auxiliary capacitance line disposed corresponding to the mth-row pixel line.

In Embodiment 2, as the lower-layer electrode electrically connected to the group of the auxiliary capacitance lines arranged alternately as viewed in the direction perpendicular to the auxiliary capacitance line, the lower-layer electrode forming the auxiliary capacitance CSa and the lower-layer electrode forming the auxiliary capacitor CSb are alternately arranged in the pixels vertically and laterally adjacent to each other. Specifically, in FIG. 12, the width of the branch of the comb-shaped lower-layer electrode forming the auxiliary capacitance CSa is narrow, and the width of the branch of the comb-shaped lower-layer electrode forming the auxiliary capacitance CSb is wide. As the lower-layer electrode (ii) electrically connected to a group of auxiliary capacitance lines CSm (m represents the number of rows of the pixels arranged in the matrix and is an even number) arranged every other, the lower-layer electrode forming the auxiliary capacitance CSa and the lower-layer electrode forming the auxiliary capacitance CSb are alternately arranged in the pixels vertically and horizontally adjacent to each other. In the lower-layer electrode (iii) electrically connected to a group of auxiliary capacitance lines CSm+1 (m represents the number of rows of the pixels arranged in the matrix and is an even number) arranged every other, the lower-layer electrode forming the auxiliary capacitance CSa and the lower-layer electrode forming the auxiliary capacitance CSb are alternately arranged in the pixels vertically and horizontally adjacent to each other. Consequently, similarly to Embodiment 1, even if the dot inversion drive is performed, the relationship between the potential difference |Vpix1−Vcs1| between the pixel electrode and the narrow lower-layer electrode and the potential difference |Vpix1+Vcs1| between the pixel electrode and the wide comb-shaped electrode becomes identical in each pixel, and the same luminance is obtained at the same gray scale in all the pixels. Thus, excellent display quality can be achieved by the dot inversion drive, and the generation of the flicker can be prevented as compared with Comparative Example 1 in which the line inversion drive is performed.

When attention is paid to the voltages at the lower-layer electrodes (ii) of the pixels (1) to (4) in FIG. 12, all the voltages are Vcs1. For this reason, the mth-row auxiliary capacitance line CSm is electrically connected to the mth-row lower-layer electrode (ii) and the (m+1)th-row lower-layer electrode (ii), and the lower-layer electrodes (ii) for two rows can be driven by one auxiliary capacitance line. The mth-row lower-layer electrode (iii) is driven by the auxiliary capacitance line CSm−1, and the (m+1)th-row lower-layer electrode (iii) is driven by the auxiliary capacitance line CSm+1.

Thus, the number of auxiliary capacitance lines can be reduced to a half as compared with Comparative Example 1, and the display region (high aperture ratio) is widened (see the pixel (4) illustrating an example of light shielding using a black matrix BM), so that the higher transmittance can be achieved as compared with Comparative Example 1.

As described above, in Embodiment 2, the higher transmittance and the prevention of the flicker can be achieved as compared with Comparative Example 1.

Figure 15:
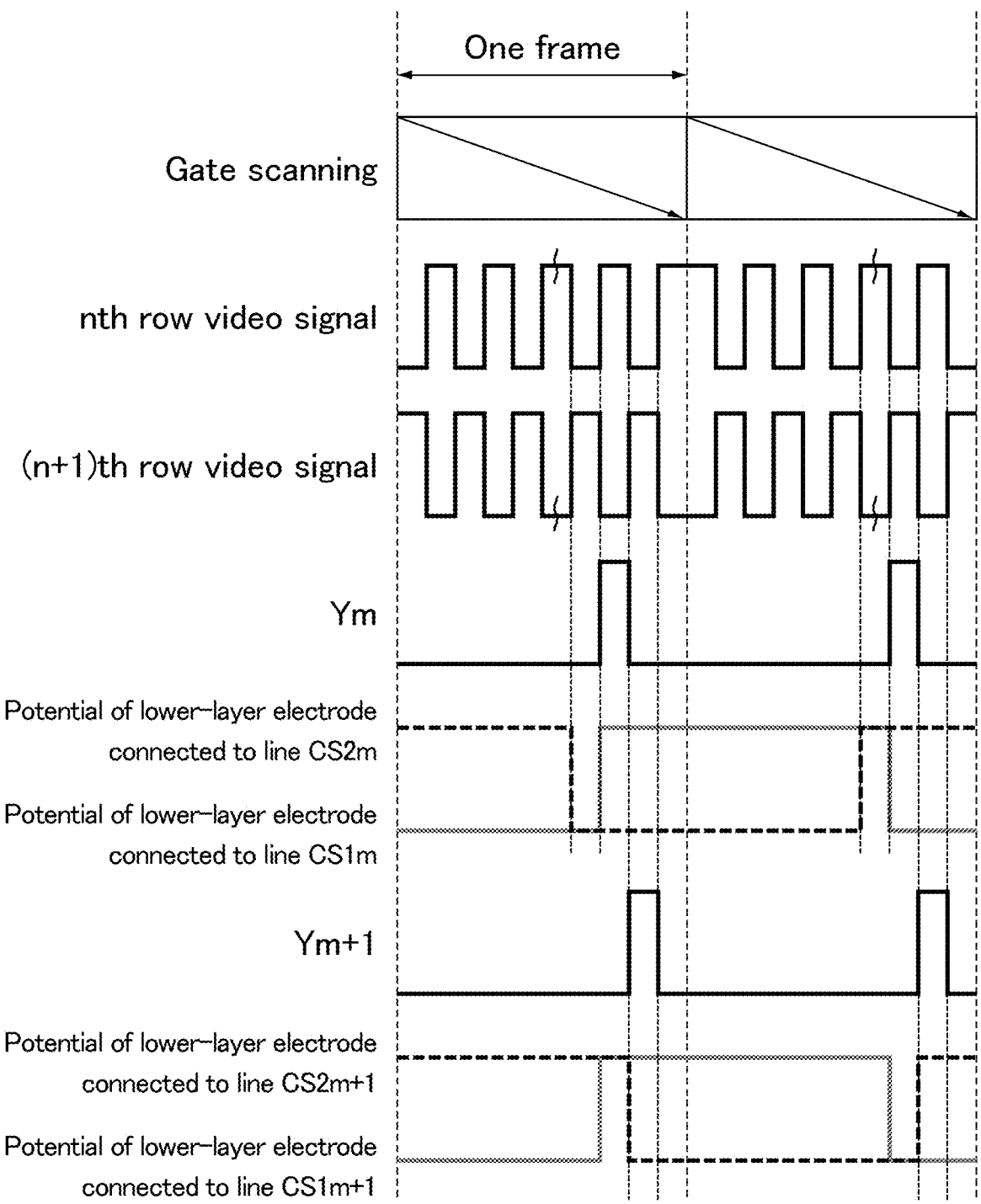
FIG. 15 is a time series diagram illustrating the voltage applied to each electrode during the white display of the first driving system in the liquid crystal display device of Embodiment 2.

FIG. 14 is a view illustrating the voltage applied to each electrode in a certain frame during the white display of the first driving system in the liquid crystal display device of Embodiment 2. In FIG. 14, the pixel means the upper-layer electrode (i), CSa means the lower-layer electrode forming the capacitance CSa, and CSb means the lower-layer electrode forming the capacitance CSb. FIG. 15 is a time series diagram illustrating the voltage applied to each electrode during the white display of the first driving system in the liquid crystal display device of Embodiment 2.

The pixel layout and the driving method in the liquid crystal display device are described in Embodiments 1, 2, and an example of a driver used to drive the scanning signal line and the auxiliary capacitance line will be illustrated in Embodiments 3 to 6.

(Embodiment 3)

Figure 16:
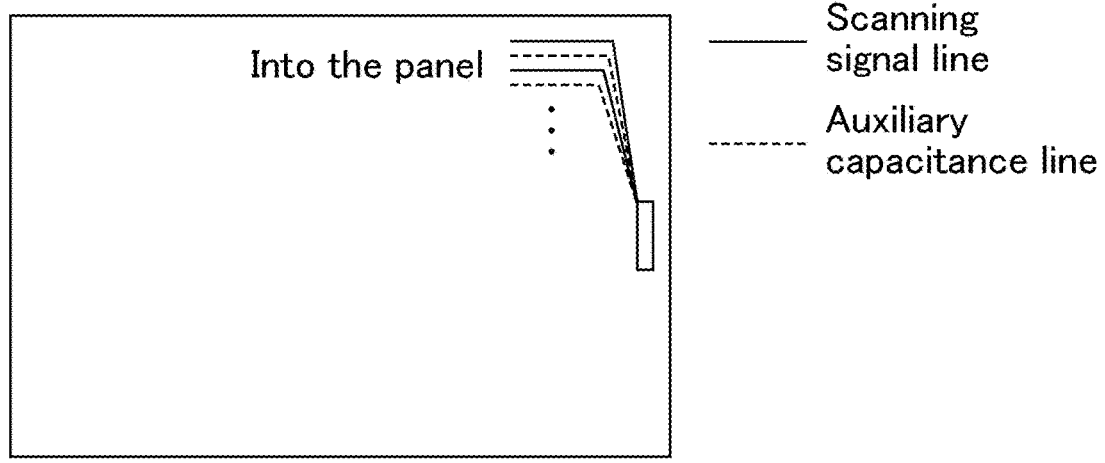
FIG. 16 is a schematic plan view illustrating a driver IC chip used to drive scanning signal lines and auxiliary capacitance lines in a liquid crystal display device of Embodiment 3.

FIG. 16 is a schematic plan view illustrating a driver IC chip used to drive scanning signal lines and auxiliary capacitance lines in a liquid crystal display device of Embodiment 3. FIG. 16 illustrates the state in which the driver IC chip is disposed on the right side of a panel and the scanning signal lines and the auxiliary capacitance lines extend from the chip toward the inside of the panel.

(Embodiment 4)

Figure 17:
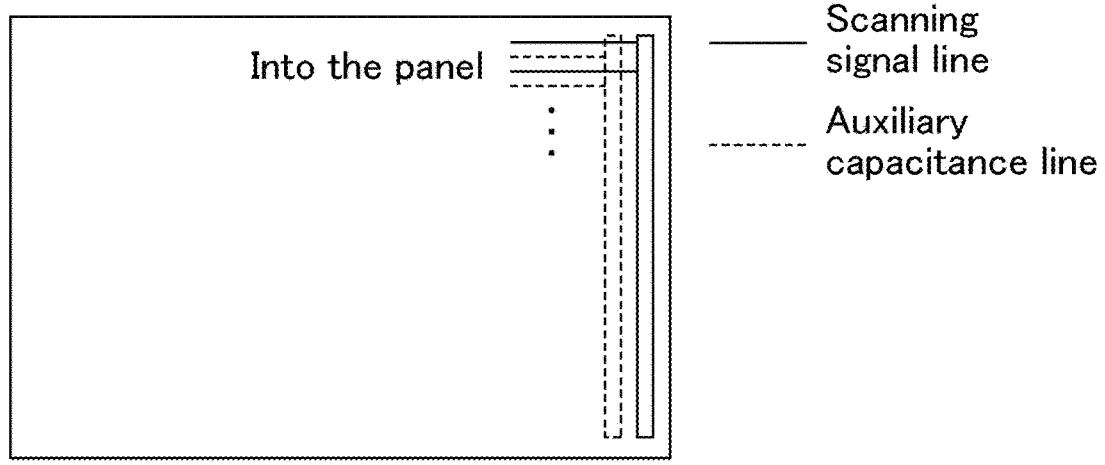
FIG. 17 is a schematic plan view illustrating a circuit on a panel used to drive scanning signal lines and a circuit on a panel used to drive auxiliary capacitance lines in a liquid crystal display device of Embodiment 4.

FIG. 17 is a schematic plan view illustrating a circuit on a panel used to drive scanning signal lines and a circuit on a panel used to drive auxiliary capacitance lines in a liquid crystal display device of Embodiment 4. FIG. 17 illustrates an example in the case that both the scanning signal lines and the auxiliary capacitance lines are driven by circuits on the panel. In FIG. 17, a scanning signal line driving circuit indicated by the solid line and an auxiliary capacity line driving circuit indicated by the broken line are disposed on the right side of the panel, and the scanning signal lines and the auxiliary capacitance lines extend from the respective circuits toward the inside of the panel.

(Embodiment 5)

Figure 18:
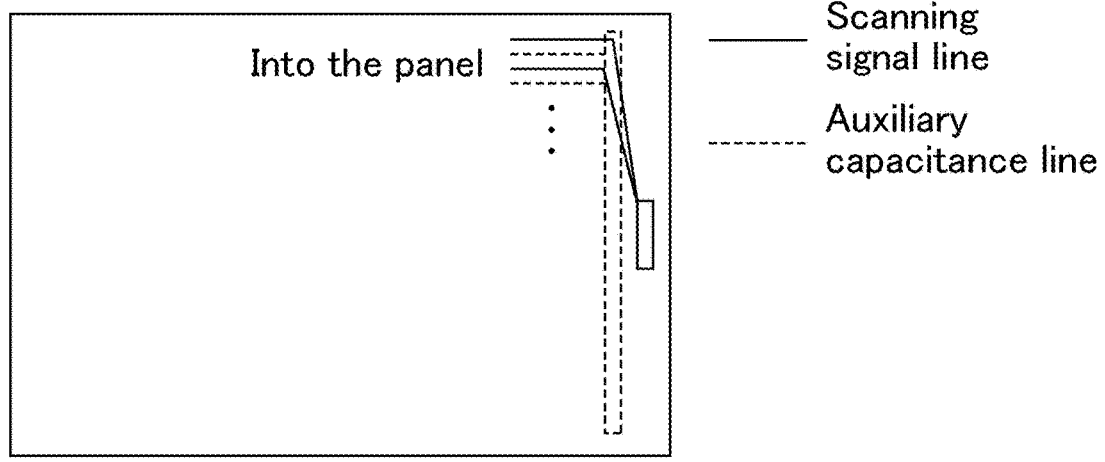
FIG. 18 is a schematic plan view illustrating a driver IC chip used to drive scanning signal lines and a circuit on a panel used to drive auxiliary capacitance lines in a liquid crystal display device of Embodiment 5.

FIG. 18 is a schematic plan view illustrating the driver IC chip used to drive scanning signal lines and a circuit on the panel used to drive auxiliary capacitance lines in a liquid crystal display device of Embodiment 5. FIG. 18 illustrates an example in which the scanning signal lines are driven by a driver IC chip and the auxiliary capacitance lines are driven by the circuit on the panel. In FIG. 18, a scanning signal line driving driver IC chip indicated by the solid line and an auxiliary capacity line driving circuit indicated by the broken line are disposed on the right side of the panel, the scanning signal lines extend toward the inside of the panel, and the auxiliary capacitance lines extend from the circuit toward the inside of the panel.

(Embodiment 6)

Figure 19:
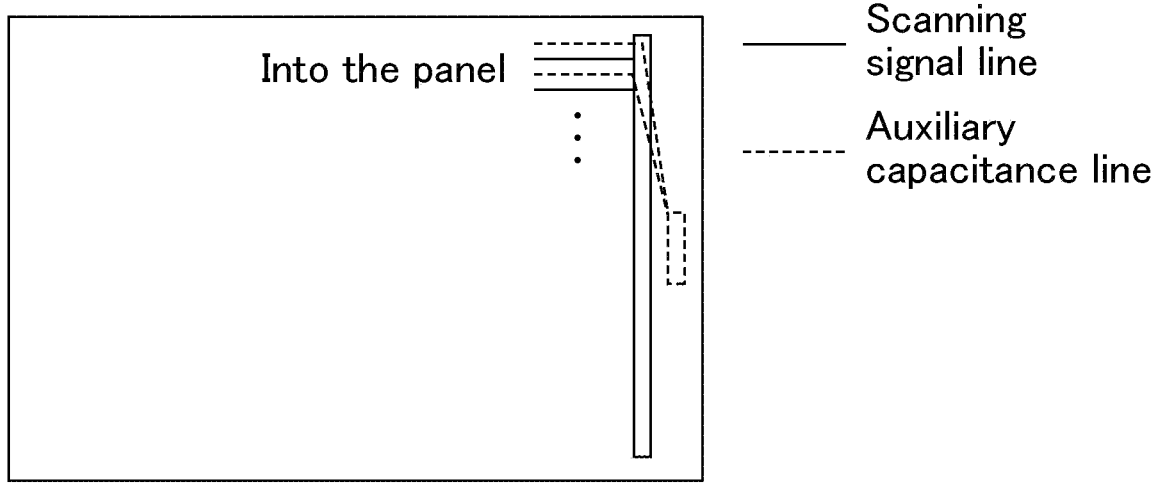
FIG. 19 is a schematic plan view illustrating a circuit on a panel used to drive scanning signal lines and a driver IC chip used to drive auxiliary capacitance lines in a liquid crystal display device of Embodiment 6.

FIG. 19 is a schematic plan view illustrating a circuit on a panel used to drive scanning signal lines and a driver IC chip used to drive auxiliary capacitance lines in a liquid crystal display device of Embodiment 6. FIG. 19 illustrates an example in which the scanning signal lines are driven by the driver IC chip and the auxiliary capacitance lines are driven by the circuit on the panel. In FIG. 19, a scanning signal line driving circuit indicated by the solid line and an auxiliary capacity line driving driver IC chip indicated by the broken line are disposed on the right side of the panel, the scanning signal lines extend from the circuit toward the inside of the panel, and the auxiliary capacitance lines extend toward the inside of the panel.

In FIGS. 16 to 19, driving sources of the scanning signal lines and the auxiliary capacitance lines are disposed in a right-side frame region. Alternatively, both the driving sources may be disposed in a left-side frame region. One of the driving sources of the scanning signal line and the auxiliary capacitance line may be disposed in the left-side frame region while the other driving source may be disposed in the right-side frame region. The half of the scanning signal lines and the half of the auxiliary capacitance lines may both be disposed in the frame regions. Either one or both of the scanning signal lines and the auxiliary capacitance lines may be disposed in the pixel region.

In the first driving system, the electric field that alternately rotates the liquid crystal molecules in different orientations in the horizontal plane can be formed, the speed enhancement can be achieved during the rise and the fall, and both the wide viewing angle and the high-speed response can be achieved. In the second driving system, similarly to the FFS mode, the electric field that rotates the liquid crystal molecules in the same orientation over the entire region, and both the wide viewing angle and the high transmittance can be achieved.

COMPARATIVE EXAMPLE 1

Figure 20:
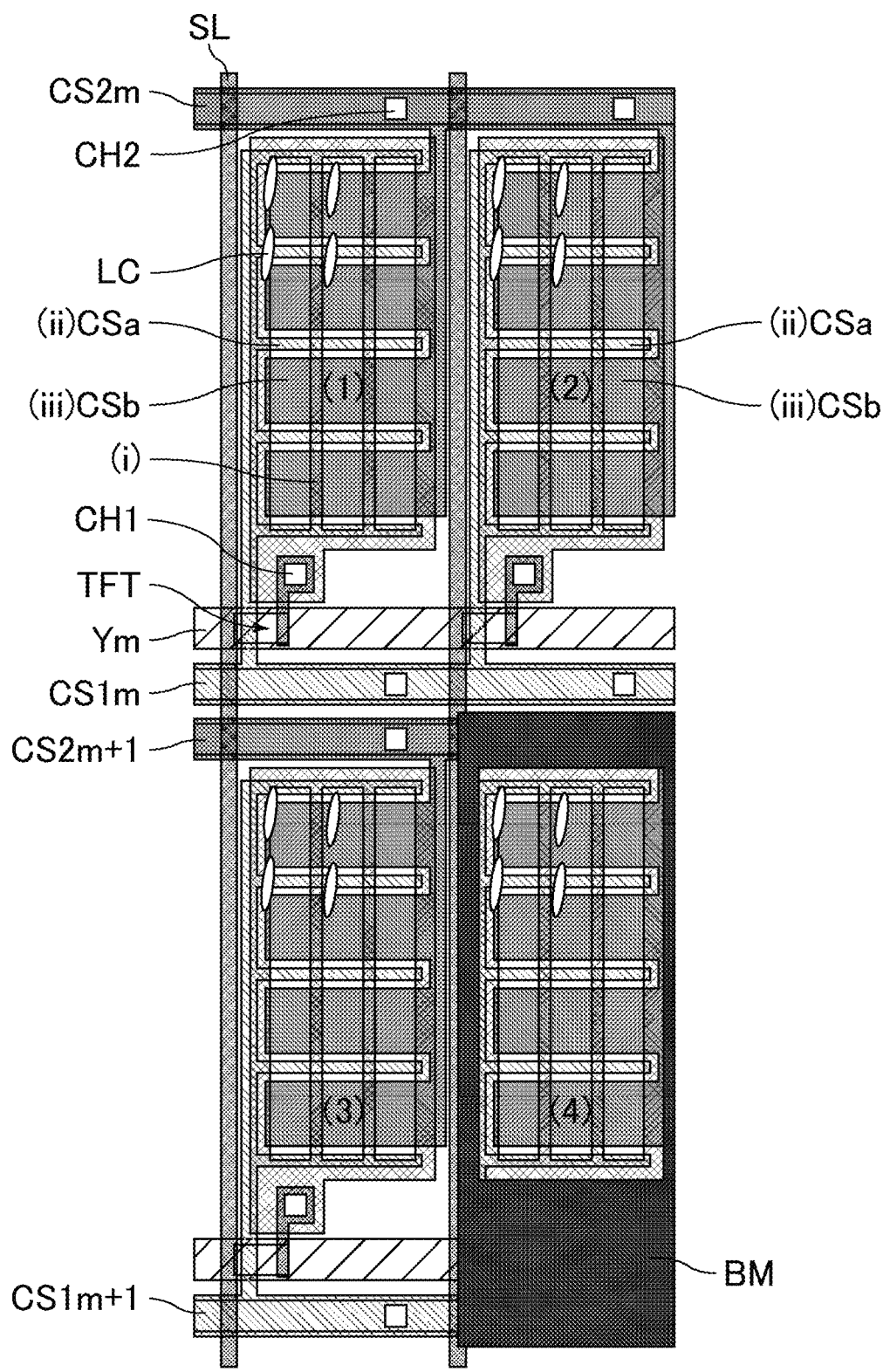
FIG. 20 is a schematic plan view illustrating an example of a pixel layout of a liquid crystal display device of Comparative Example 1.
Figure 21:
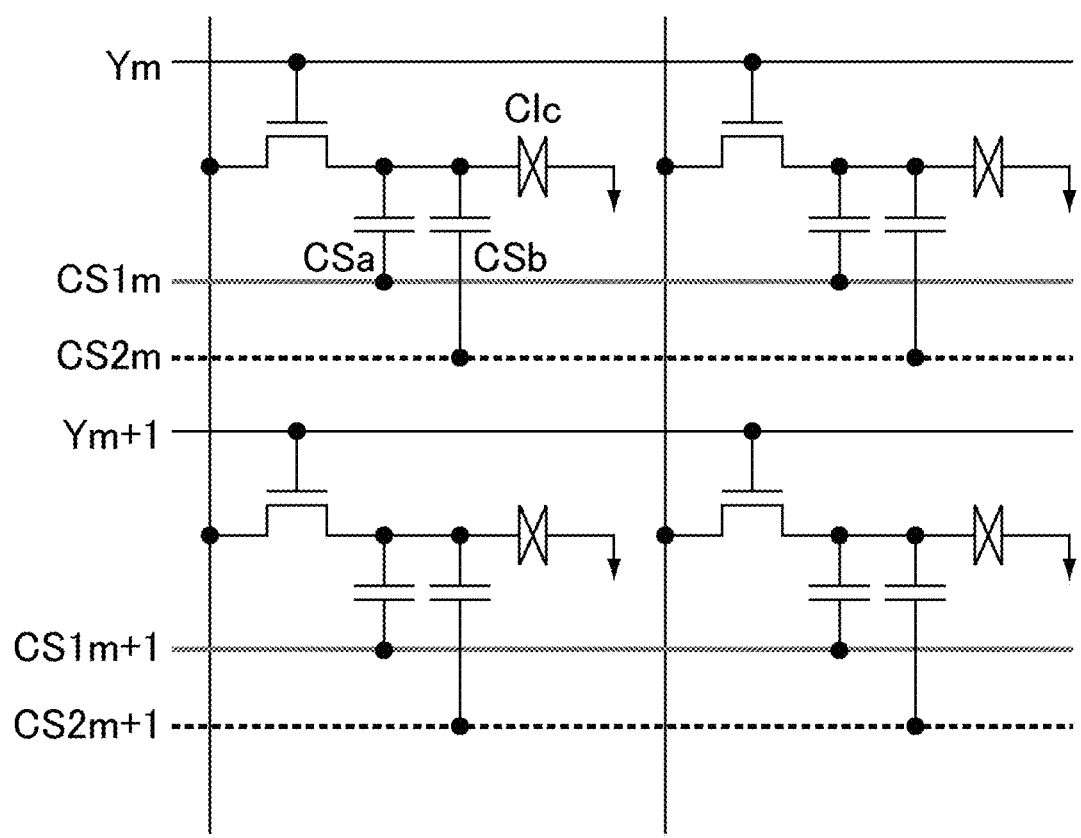
FIG. 21 is a view illustrating an equivalent circuit of a pixel in the liquid crystal display device of Comparative Example 1.

FIG. 20 is a schematic plan view illustrating an example of a pixel layout of a liquid crystal display device of Comparative Example 1. FIG. 21 is a view illustrating an equivalent circuit of a pixel in the liquid crystal display device of Comparative Example 1. FIG. 22 is a view illustrating the voltage applied to each electrode in a certain frame during the white display in the liquid crystal display device of Comparative Example 1. In FIG. 22, the pixel means an upper-layer electrode (i), CSa means a lower-layer electrode forming the capacitance CSa, and CSb means a lower-layer electrode forming the capacitance CSb.

Auxiliary capacitance lines $CS1m$, $CS2m$ corresponding to each scanning signal line are disposed and connected to lower-layer electrodes (ii), (iii) at contact holes.

In Comparative Example 1, there are the following two disadvantages.

(1) Because two auxiliary capacitance lines are required in each 1H line, the display region becomes narrow (see pixel (4) illustrating an example of the light shading using the black matrix BM).

(2) The lower-layer electrodes (ii), (iii) are connected in each 1H line, and the lower-layer electrodes (ii), (iii) are connected only by the lower-layer electrodes (ii) or only by the lower-layer electrodes (iii), so that each line becomes the same potential (same polarity). In the same gray scale, desirably the relationship between the potential difference between the pixel electrode (i) and the lower-layer electrode (ii) and the potential difference between the pixel electrode (i) and the comb-shaped electrode (iii) is identical in each pixel. Thus, because the potential at the pixel electrode also has the same polarity in each 1H line, only the 1H-line inversion drive can be performed, and the flicker is generated.

In the liquid crystal display device of the present embodiment as described above, in the first driving system, the lateral electric field is applied between the pair of lower-layer comb-shaped electrodes during the rise, so that the strong electric field acts on the liquid crystal molecules in the entire horizontal area to enhance the response speeds. During the fall, in addition to the action of the strong restoring force that returns the in-plane bend alignment and the splay alignment to the original state, the liquid crystal molecules react with the electric field generated by the lower-layer comb-shaped electrode, which allows the high-speed response that cannot be achieved in the conventional FFS mode.

In the second driving system, comb-shaped electrodes on the lower side of the two-layered electrode are set to the same potential to generate the fringe electric field between the comb-shaped electrodes and the upper slit electrode, which allows the achievement of the drive that obtains the transmittance higher than that of the drive that achieves the high-speed response.

One of the features of the above embodiments is that these two kinds of driving can be switched according to the purpose and situation to achieve the wide viewing angle, the high-speed response, and the high transmittance. The liquid crystal display device of the present invention may be any device that can perform at least the first driving system.

In the liquid crystal display device of the present embodiments described above, the display can be performed by appropriately switching between the first driving system and the second driving system. In each driving system, the desired display can be performed by appropriately combining the white display and the black display.

Preferably the liquid crystal display device of the present invention includes a control device that performs the first driving system, and more preferably includes a control device that performs the first driving system and the second driving system by switching between the first driving system and the second driving system. Consequently, the wide viewing angle can be achieved, and the high-speed response or the high transmittance can be achieved. Thus, the liquid crystal display device that satisfies all the characteristics of the high-speed response, the wide viewing angle, and the high transmittance with one type of electrode configuration can be constructed.

Preferably the liquid crystal display device of the present invention includes a control device that automatically switches between the first driving system and the second driving system on a predetermined condition. For example, preferably the control device is equipped with a temperature sensor, and automatically switches between the first driving system and the second driving system according to the temperature. For example, preferably the control device performs the second driving system in which high transmittance can be achieved in an environment of a temperature at which a delay of the response speed is not a problem (for example, a temperature range where the lower limit is any one of −20° C. to 20° C.), and performs the first driving system in which the high-speed response can be achieved in an environment of a low temperature (for example, a temperature range where the upper limit is any one of −20° C. to 20° C.) at which the response speed becomes slow. Consequently, the desired effects can be obtained more appropriately.

The liquid crystal display device of the present invention may include a control device that switches between the first driving and the second driving system in response to a user's instruction.

The present invention may be a liquid crystal display device driving method in which the liquid crystal display device described above is used.

In the case that the AC drive of the liquid crystal in which the AC voltage is applied only to the electrode included in the lower substrate is performed like the liquid crystal display device of the present invention, the circuit for AC drive, the driver, and the line may be disposed only in the electrode included in the lower substrate as in the past. Thus, for example, a degree of freedom of driving the liquid crystal display device of the present invention is particularly higher than that of the liquid crystal display device in which the circuit for AC driving, the driver, and the line are disposed on both the upper and lower substrates in order to apply the AC voltage to the electrodes of the upper and lower substrates to perform AC driving of the liquid crystal.

(Additional Remarks)

Examples of preferred aspects of the liquid crystal display device of the present invention will be described below. That is, in addition to the preferable examples described above, preferred examples to be described later are also examples of preferred embodiments of the present invention, and both may be appropriately combined without departing from the scope of the present invention.

In the liquid crystal display device of the present invention, preferably the lower substrate includes a first auxiliary capacitance line and a second auxiliary capacitance line for the first pixel line, and a group of first auxiliary capacitance electrodes in the first pixel line is electrically connected to the first auxiliary capacitance line, and a group of second auxiliary capacitance electrodes in the first pixel line is electrically connected to the second auxiliary capacitance line.

In the liquid crystal display device of the present invention, preferably the lower substrate includes one auxiliary capacitance line for the first pixel line, and the group of first auxiliary capacitance electrodes in the first pixel line is electrically connected to the one auxiliary capacitance line, and the group of second auxiliary capacitive electrodes in the first pixel line is electrically connected to the auxiliary capacitance line provided for a second pixel line adjacent to the first pixel line.

In the liquid crystal display device of the present invention, preferably each of the first auxiliary capacitance electrode and each of the second auxiliary capacitance electrode have a comb shape constructed with a trunk and a branch extending from the trunk, and an average width of the branch portion in the display region of each of the pixels differs from an average width of the branch of the second auxiliary capacitance electrode in the display region of each of the pixels.

In the liquid crystal display device of the present invention, preferably in the driving operation, an AC voltage is applied to the pixel electrode, the first auxiliary capacitance electrode, and the second auxiliary capacitance electrode, and the absolute values of the potentials at the first auxiliary capacitance electrode and the second auxiliary capacitance electrode are equal to each other, with a center potential at the pixel electrode being set to 0 V.

In the liquid crystal display device of the present invention, preferably in the driving operation, the AC voltage is applied to the pixel electrode, the first auxiliary capacitance electrode, and the second auxiliary capacitance electrode, and the polarities of the potentials of the first auxiliary capacitance electrode and the second auxiliary capacitance electrode are different, with a center potential at the pixel electrode being set to 0 V.

In the liquid crystal display device of the present invention, preferably the lower substrate includes one scanning signal line for the first pixel line, and in the driving operation, the scanning signal line is driven by a driver IC chip or a circuit on a panel.

In the liquid crystal display device of the present invention, preferably in the driving operation, the auxiliary capacitance lines are driven by the driver IC chip or the circuit on the panel.

The liquid crystal display device of the present invention is preferably configured to switch between a first driving system that performs the driving operation and a second driving system that performs a driving operation to generate an electric field rotating the liquid crystal molecules contained in the liquid crystal layer in one direction in the horizontal plane with respect to the main surfaces of the upper and lower substrates are performed while switched.

Typically, the electric field rotating the liquid crystal molecules in one direction in the horizontal plane with respect to the main surfaces of the upper and lower substrates is generated by the one pixel electrode and the two auxiliary capacitance electrodes. For example, the two auxiliary capacitance electrodes are set to the same potential (for example, 0 V), and the electric field (fringe electric field) can be generated between the auxiliary capacitance electrodes and the pixel electrode.

In the liquid crystal display device of the present invention, the liquid crystal molecules contained in the liquid crystal layer may have either positive or negative anisotropy of dielectric constant, but preferably the liquid crystal molecules have the positive anisotropy of dielectric constant.

In the liquid crystal display device of the present invention, preferably the lower substrate includes a thin-film transistor element, and the thin-film transistor element includes an oxide semiconductor.

In the liquid crystal display device of the present invention, preferably the lower substrate includes a plurality of scanning signal lines, and the potential at the corresponding auxiliary capacitance line is changed at the same time as each scanning signal line is selected.

In the liquid crystal display device of the present invention, preferably the lower substrate includes the plurality of scanning signal lines, and the potential at the corresponding auxiliary capacitance line is changed before each scanning signal line is selected.

In the liquid crystal display device of the present invention, preferably the lower substrate includes the plurality of scanning signal lines, and the potential at the corresponding auxiliary capacitance line is changed after each scanning signal line is selected.

Examples of the liquid crystal display device of the present invention include an in-vehicle device such as a car navigation system, an electronic book reader, a digital photo frame, an industrial appliance, a television, a personal computer, a smart phone, and a tablet terminal. The present invention is preferably applied to a device, such as the in-vehicle device such as the car navigation system, which can be used in both a high-temperature environment and a low-temperature environment.

In the lower substrate, the electrode structure and the like of the liquid crystal display device of the present invention can be checked by microscopic observation using a scanning electron microscope (SEM).

REFERENCE SIGNS LIST (i) upper-layer electrode
(ii), (iii) lower-layer (comb-shaped) electrode
(1), (2), (3), (4) pixel
CSa auxiliary capacitance (formed between the pixel electrode and the lower-layer comb-shaped electrode having narrow branch)
CSb auxiliary capacitance (formed between the pixel electrode and the lower-layer comb-shaped electrode having wide branch)
CSm, CS1m, CS2m mth-row auxiliary capacitance line
CSm+1, CS1m+1, CS2m+1 (m+1)th-row auxiliary capacitance line
BM black matrix
CH1, CH2, CH3 contact hole
TFT thin-film transistor element
SL data signal line
Ym (mth-row) scanning signal line
Ym+1 ((m+1)th-row) scanning signal line
LC liquid crystal molecule
10 lower substrate
11, 21 glass substrate
13 insulating layer
20 upper substrate
30 liquid crystal layer
40 backlight

The invention claimed is:

1. A liquid crystal display device comprising:
an upper substrate and a lower substrate; and
a liquid crystal layer sandwiched between the upper and lower substrates,
wherein the lower substrate includes a pixel electrode, a first auxiliary capacitance electrode, and a second auxiliary capacitance electrode for one pixel, and one or two auxiliary capacitance lines for one pixel line including pixels,
a group of the first auxiliary capacitive electrodes and a group of the second auxiliary capacitive electrodes in a first pixel line are electrically connected to different auxiliary capacitance lines,
each of the first auxiliary capacitance electrode and the second auxiliary capacitance electrode and the pixel electrode in each of the pixels overlap each other in a plan view,
the first auxiliary capacitance electrode and the second auxiliary capacitance electrode differ from each other in shape in a display region of each of the pixels,
the shape of the first auxiliary capacitance electrode in the display region of a first pixel is identical to the shape of the second auxiliary capacitance electrode in the display region of a second pixel adjacent to the first pixel,
the shape of the second auxiliary capacitance electrode in the display region of the first pixel is identical to the shape of the first auxiliary capacitance electrode in the display region of the second pixel adjacent to the first pixel,
each of the first auxiliary capacitance electrodes and each of the second auxiliary capacitance electrodes have a comb shape constructed with a trunk and a branch extending from the trunk, and an average width of the branch of the first auxiliary capacitance electrode in the display region of each of the pixels differs from an average width of the branch of the second auxiliary capacitance electrode in the display region of each of the pixels and
each of the first auxiliary capacitance electrodes and each of the second auxiliary capacitance electrodes are configured to be driven by a driving operation through the respective corresponding auxiliary capacitance lines to which the first auxiliary capacitance electrode and the second auxiliary capacitance electrode are electrically connected.

2. The liquid crystal display device according to claim 1, wherein the lower substrate includes a first auxiliary capacitance line and a second auxiliary capacitance line for the first pixel line,
the group of the first auxiliary capacitive electrodes in the first pixel line is electrically connected to the first auxiliary capacitive line, and
the group of the second auxiliary capacitance electrodes in the first pixel line is electrically connected to the second auxiliary capacitance line.

3. The liquid crystal display device according to claim 1, wherein the lower substrate includes one auxiliary capacitance line for the first pixel line,
the group of the first auxiliary capacitance electrodes in the first pixel line is electrically connected to the one auxiliary capacitance line, and
the group of the second auxiliary capacitance electrodes in the first pixel line is electrically connected to the auxiliary capacitance line provided for a second pixel line adjacent to the first pixel line.

4. The liquid crystal display device according to claim 1,
wherein in the driving operation, an AC voltage is applied to the pixel electrode, the first auxiliary capacitance electrode, and the second auxiliary capacitance electrode, and
the absolute values of potentials at the first auxiliary capacitance electrode and the second auxiliary capacitance electrode are equal to each other, with a center potential at the pixel electrode being set to 0 V.

5. The liquid crystal display device according to claim 1,
wherein in the driving operation, the AC voltage is applied to the pixel electrode, the first auxiliary capacitance electrode, and the second auxiliary capacitance electrode, and
the polarities of the potentials of the first auxiliary capacitance electrode and the second auxiliary capacitance electrode are different, with the center potential at the pixel electrode being set to 0 V.

6. The liquid crystal display device according to claim 1,
wherein the lower substrate includes one scanning signal line for the first pixel line, and
in the driving operation, the scanning signal line is driven by a driver IC chip or a circuit on a panel.

7. The liquid crystal display device according to claim 1,
wherein in the driving operation, the auxiliary capacitance lines are driven by a driver IC chip or a circuit on a panel.

8. The liquid crystal display device according to claim 1,
wherein the liquid crystal molecules contained in the liquid crystal layer have positive anisotropy of dielectric constant.

9. The liquid crystal display device according to claim 1,
wherein the lower substrate includes a thin-film transistor element, and
the thin-film transistor element includes an oxide semiconductor.

10. A liquid crystal display device comprising:
an upper substrate and a lower substrate; and
a liquid crystal layer sandwiched between the upper and lower substrates,
wherein the lower substrate includes a pixel electrode, a first auxiliary capacitance electrode, and a second auxiliary capacitance electrode, and one or two auxiliary capacitance lines for one pixel line including pixels,
a group of the first auxiliary capacitive electrodes and a group of the second auxiliary capacitive electrodes in a first pixel line are electrically connected to different auxiliary capacitance lines,
each of the first auxiliary capacitance electrode and the second auxiliary capacitance electrode and the pixel electrode in each of the pixels overlap each other in a plan view,
the first auxiliary capacitance electrode and the second auxiliary capacitance electrode differ from each other in shape in a display region of each of the pixels,
the shape of the first auxiliary capacitance electrode in the display region of a first pixel is identical to the shape of the second auxiliary capacitance electrode in the display region of a second pixel adjacent to the first pixel,
the shape of the second auxiliary capacitance electrode in the display region of the first pixel is identical to the shape of the first auxiliary capacitance electrode in the display region of the second pixel adjacent to the first pixel,
each of the first auxiliary capacitance electrodes and each of the second auxiliary capacitance electrodes are configured to be driven by a driving operation through the respective corresponding auxiliary capacitance lines to which the first auxiliary capacitance electrode and the second auxiliary capacitance electrode are electrically connected, and
the liquid crystal display device is configured to switch between a first driving system that performs the driving operation and a second driving system that performs a driving operation to generate an electric field rotating liquid crystal molecules contained in the liquid crystal layer in one orientation in a horizontal plane with respect to main surfaces of the upper and lower substrates.

11. The liquid crystal display device according to claim 10,
wherein the lower substrate includes a first auxiliary capacitance line and a second auxiliary capacitance line for the first pixel line,
the group of the first auxiliary capacitive electrodes in the first pixel line is electrically connected to the first auxiliary capacitive line, and
the group of the second auxiliary capacitance electrodes in the first pixel line is electrically connected to the second auxiliary capacitance line.

12. The liquid crystal display device according to claim 10,
wherein the lower substrate includes one auxiliary capacitance line for the first pixel line,
the group of the first auxiliary capacitance electrodes in the first pixel line is electrically connected to the one auxiliary capacitance line, and
the group of the second auxiliary capacitance electrodes in the first pixel line is electrically connected to the auxiliary capacitance line provided for a second pixel line adjacent to the first pixel line.

13. The liquid crystal display device according to claim 10,
wherein in the driving operation performed by the first driving system, an AC voltage is applied to the pixel electrode, the first auxiliary capacitance electrode, and the second auxiliary capacitance electrode, and
the absolute values of potentials at the first auxiliary capacitance electrode and the second auxiliary capacitance electrode are equal to each other, with a center potential at the pixel electrode being set to 0 V.

14. The liquid crystal display device according to claim 10,
wherein in the driving operation performed by the first driving system, the AC voltage is applied to the pixel electrode, the first auxiliary capacitance electrode, and the second auxiliary capacitance electrode, and
the polarities of the potentials of the first auxiliary capacitance electrode and the second auxiliary capacitance electrode are different, with the center potential at the pixel electrode being set to 0 V.

15. The liquid crystal display device according to claim 10,
wherein the lower substrate includes one scanning signal line for the first pixel line, and
in the driving operation, the scanning signal line is driven by a driver IC chip or a circuit on a panel.

16. The liquid crystal display device according to claim 10,
wherein in the driving operation, the auxiliary capacitance lines are driven by a driver IC chip or a circuit on a panel.

17. The liquid crystal display device according to claim 10,
wherein the liquid crystal molecules contained in the liquid crystal layer have positive anisotropy of dielectric constant.

18. The liquid crystal display device according to claim 10,
wherein the lower substrate includes a thin-film transistor element, and
the thin-film transistor element includes an oxide semiconductor.

* * * * *